United States Patent
Kim et al.

(10) Patent No.: US 10,251,259 B2
(45) Date of Patent: Apr. 2, 2019

(54) CIRCUIT BOARD AND CONDUCTIVE PATTERN STRUCTURE

(71) Applicant: SAMSUNG ELECTRO-MECHANICS CO., LTD., Suwon-si (KR)

(72) Inventors: Han Kim, Suwon-si (KR); Seong Hee Choi, Suwon-si (KR); Dae Hyun Park, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 84 days.

(21) Appl. No.: 15/198,679

(22) Filed: Jun. 30, 2016

(65) Prior Publication Data
US 2017/0099729 A1  Apr. 6, 2017

(30) Foreign Application Priority Data
Oct. 6, 2015 (KR) .................. 10-2015-0140502

(51) Int. Cl.
*H01P 3/08* (2006.01)
*H05K 1/02* (2006.01)

(52) U.S. Cl.
CPC .............. *H05K 1/0253* (2013.01); *H01P 3/08* (2013.01); *H01P 3/081* (2013.01); *H01P 3/085* (2013.01); *H05K 1/0298* (2013.01); *H05K 1/0225* (2013.01); *H05K 2201/09263* (2013.01); *H05K 2201/09681* (2013.01); *H05K 2201/09781* (2013.01)

(58) Field of Classification Search
CPC . H01P 3/08; H01P 3/081; H01P 3/085; H05K 1/0253; H05K 1/0298; H05K 1/0225

USPC ........................................... 333/33
See application file for complete search history.

(56) References Cited

U.S. PATENT DOCUMENTS

| | | | |
|---|---|---|---|
| 2,963,535 A | * | 12/1960 | Wegener ............ H05K 1/0224 156/283 |
| 5,917,149 A | | 6/1999 | Barcley et al. |
| 2002/0084876 A1 | | 7/2002 | Wright et al. |
| 2006/0144616 A1 | | 7/2006 | Lin et al. |
| 2007/0227762 A1 | | 10/2007 | Yang et al. |
| 2008/0023844 A1 | | 1/2008 | Choi et al. |
| 2009/0255723 A1 | | 10/2009 | Lai |

(Continued)

FOREIGN PATENT DOCUMENTS

| CN | 2770275 Y | 4/2006 |
|---|---|---|
| CN | 103999285 A1 | 8/2014 |

(Continued)

OTHER PUBLICATIONS

Chinese Office Action dated Oct. 8, 2018 in corresponding Chinese Patent Application No. 201610608750.6 (11 pages in English and 7 pages in Chinese).

*Primary Examiner* — Stephen E. Jones
*Assistant Examiner* — Samuel S Outten
(74) *Attorney, Agent, or Firm* — NSIP Law

(57) ABSTRACT

A circuit board includes a first conductive layer, a second conductive layer, and a first insulating layer disposed between the first conductive layer and the second conductive layer, wherein the first conductive layer includes a signal line, the second conductive layer includes a ground line, and the ground line of the second conductive layer includes a pattern area patterned in a meander shape.

20 Claims, 17 Drawing Sheets

(56) References Cited

U.S. PATENT DOCUMENTS

| | | | |
|---|---|---|---|
| 2010/0096170 A1 | 4/2010 | Lin et al. | |
| 2014/0231121 A1 | 8/2014 | Pai | |
| 2014/0376199 A1* | 12/2014 | Kato | ........................ H01P 3/085 |
| | | | 361/753 |

FOREIGN PATENT DOCUMENTS

| | | |
|---|---|---|
| JP | 7-202358 A | 8/1995 |
| KR | 10-0744143 B1 | 8/2007 |
| KR | 10-2012-0050175 A | 5/2012 |

* cited by examiner

CIRCUIT BOARD AND CONDUCTIVE PATTERN STRUCTURE

CROSS-REFERENCE TO RELATED APPLICATION(S)

This application claims the benefit under 35 USC 119(a) of Korean Patent Application No. 10-2015-0140502, filed on Oct. 6, 2015 in the Korean Intellectual Property Office, the entire disclosure of which is incorporated herein by reference for all purposes.

BACKGROUND

1. Field

The following description relates to a circuit board and a conductive pattern structure.

2. Description of Related Art

A circuit board may be generally classified as either a microstrip circuit board or a stripline circuit board based on the type of transmission line used in the circuit board and the electromagnetic field produced by the circuit board. Both the microstrip and the stripline circuit board have a ground and an electrical field formed by a signal line. In these circuit boards, the electrical field generated by the circuit board influences the characteristic impedance of the circuit board.

In either a microstrip circuit board or a stripline circuit board, the impedance characteristics of the circuit board are generally determined by a line width and thickness of the signal line, a height between the signal line and the ground, a dielectric constant of a medium that forms the insulating layer, and the like. However, in accordance with an industry trend toward producing thinner and portable electronic products, a thickness of the insulating layer tends to be reduced when the circuit board to be included in the electronic products is designed. The reduction in the thickness of the insulating layer may result in the characteristic impedance of the circuit board being reduced beyond a desired value.

In order to prevent the impedance reduction, a method for adjusting the line width or the thickness of the signal line is proposed. However, when the line width or the thickness of a signal line is adjusted to control the impedance of the circuit board, while the impedance may be matched to the desired value, a transmission loss may inevitably occur. Further, due to the adjustment to the line width and the thickness of the signal line, the freedom to design a layout for the circuit element may be also significantly compromised.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a circuit board includes a first conductive layer, a second conductive layer, and an insulating layer disposed between the first conductive layer and the second conductive layer, wherein the first conductive layer includes a signal line, the second conductive layer includes a ground line, and in a corresponding area provided with the signal line and the ground line, the ground line is patterned so that changing a position of the signal line within the corresponding area results in an impedance change of 1Ω or less.

The ground line may include a pattern area patterned in a meander shape.

A shape of unit pattern of the ground line under the signal line may be substantially the same regardless of a position of the signal line within the corresponding area.

In the corresponding area provided with the signal line and the ground line, a return path of the ground line corresponding to the signal line may remain substantially the same regardless of a position of the signal line.

The ground line may include a pattern area patterned in an oblique meander shape.

The second conductive layer may further include dummy patterns, and the dummy patterns may not be connected to the ground line.

In another general aspect, a circuit board includes a first conductive layer, a second conductive layer, and an insulating layer disposed between the first conductive layer and the second conductive layer, wherein the first and second conductive layers each include a signal line and a ground line, and outer unit patterns are disposed along an edge portion of the ground line, and inner unit patterns are disposed between the outer unit patterns, the outer unit patterns connecting the inner unit patterns to one another.

The outer unit patterns may have an opened curve shape, and the inner unit patterns may have an obliquely inclined shape, the outer unit patterns and the inner unit patterns being connected to each other to form a return path of the ground line.

The inner unit patterns may have an obliquely inclined shape with a constant width.

The inner unit patterns may be disposed with a constant interval therebetween.

The inner unit patterns may include obliquely inclined stripes aligned along substantially the same direction.

The inner unit patterns may include obliquely inclined stripes forming a zigzag shape.

The second conductive layer may further include dummy patterns, and the dummy patterns may be disposed between the outer unit patterns and the inner unit patterns.

In another general aspect, a circuit board includes a first conductive layer, a second conductive layer, and a first insulating layer disposed between the first conductive layer and the second conductive layer, wherein the first conductive layer includes a signal line, the second conductive layer includes a ground line, and the ground line of the second conductive layer includes a pattern area patterned in a meander shape.

The pattern area of the ground line may be patterned in an oblique meander shape.

The general aspect of the circuit board may further include a third conductive layer and a second insulating layer disposed between the third conductive layer and the first conductive layer, wherein the third conductive layer includes a second ground line, and the second ground line includes a pattern area patterned in a meander shape.

In another general aspect, a conductive pattern structure includes a conductive path in which conductive patterns are connected to each other, wherein the conductive patterns include: outer conductive patterns having an opened curved shape disposed along an edge portion of the conductive path, and inner conductive patterns having an obliquely inclined shape disposed between the outer conductive patterns.

In another general aspect, a circuit board includes a first conductive layer including a signal line, a second conductive layer including a ground line, and an insulating layer disposed between the first conductive layer and the second conductive layer, wherein the ground line includes a pattern area in which the ground line intersects the signal line in a plan view by making a plurality of passes across the signal line, and a current direction in the ground line alternates in the plurality of passes across the signal line.

The plurality of passes across the signal line may include a first pass and a second pass across the signal line, and the current direction across the first pass may be configured to be substantially opposite to the current direction across the second pass.

The ground line may be patterned in a meander shape in the pattern area.

The current direction in the ground line may not change when a position of the signal line changes within a corresponding area of the ground line.

A conductive pattern structure for a circuit board includes outer conductive patterns disposed along an edge portion of a pattern area, and inner conductive patterns disposed in the pattern area and connected to one another via the outer conductive patterns to form a conductive path having a meander shape.

The inner conductive patterns may include obliquely inclined conductive stripes that are connected via the outer conductive patterns to form an oblique meander shape.

The inner conductive patterns may have a zigzag shape, a curved wave shape, or an obliquely inclined shape and may be connected to each other via the outer conductive patterns to form the meander shape.

The inner conductive patterns may include a first inner conductive pattern and a second inner conductive patter, and the first inner conductive pattern and the second inner conductive pattern may be disposed parallel to each another such that a current direction through the first inner conductive pattern and a current direction through the second inner conductive pattern are opposite to each other.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
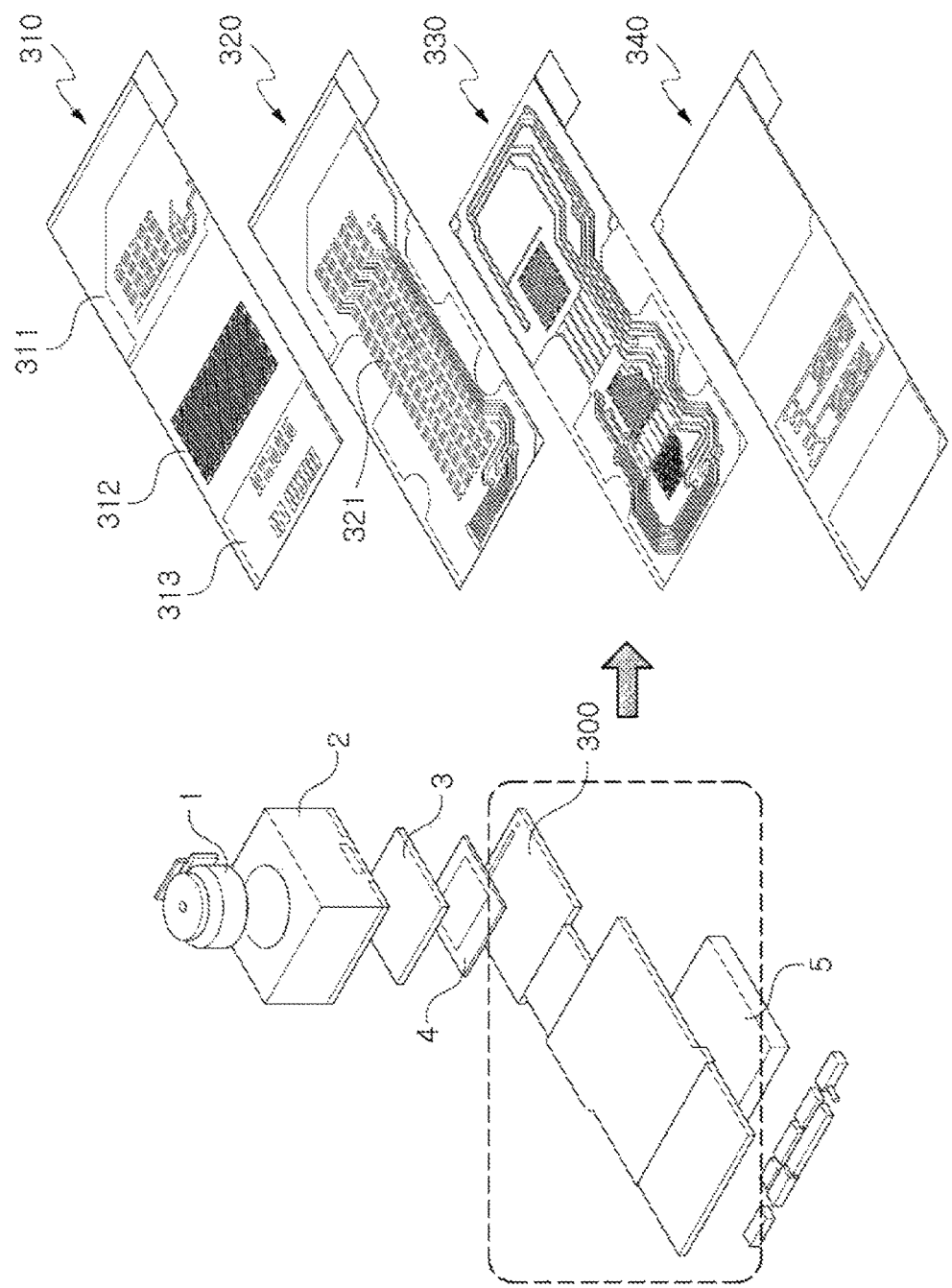
FIG. 1 schematically illustrates an example of a circuit board used in an electronic component.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the embodiments described herein. Rather, the embodiments described herein have been provided so that this disclosure will be thorough and complete, and will convey the full scope of the disclosure to one of ordinary skill in the art.

Throughout the specification, it is to be understood that when an element, such as a layer, region or substrate, is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, other elements or layers intervening therebetween cannot be present. Like numerals refer to like elements throughout. As used herein, the term "and/or" includes any and all combinations of one or more of the associated listed items.

Although terms such as "first," "second," and "third," may be used herein to describe various members, components, regions, layers and/or sections, these members, components, regions, layers, or sections are not to be limited by these terms. These terms are only used to distinguish one member, component, region, layer or section from another member, component, region, layer or section. Thus, a first member, component, region, layer or section discussed in embodiments below may also be referred to as a second member, component, region, layer or section without departing from the teachings of the embodiments.

Spatially relative terms such as "above," "upper," "below," and "lower" may be used herein for ease of description to describe one element's relationship to one or more other elements as shown in the figures. It is to be understood that the spatially relative terms are intended to encompass different orientations of the device in use or operation in addition to the orientation depicted in the figures. For example, if the device in the figures is turned over, elements described as being "above" another element or being an "upper" element will then be "below" the other element or will be a "lower" element. Thus, the term "above" can encompass both the above and below orientations depending on a particular direction of the figures. The device may also be oriented in other ways (for example, rotated 90 degrees or at other orientations) and the spatially relative descriptors used herein are to be interpreted accordingly.

The terminology used herein describes various embodiments only and is not to be used to limit the present disclosure. As used herein, the singular terms "a," "an," and "the" are intended to include the plural terms as well, unless the context clearly indicates otherwise. Further, as used herein, the terms "include," "comprises," and "have" specify the presence of stated features, numbers, operations, members, elements, and/or combinations thereof, but do not preclude the presence or addition of one or more other features, operations, members, elements, and/or combinations thereof.

Hereinafter, embodiments will be described with reference to schematic diagrams. In the drawings, due to manufacturing techniques and/or tolerances, for example, modifications of the shape shown may be estimated. Thus, the embodiments described herein are not to be construed as being limited to the shapes of regions shown herein, but are to be construed as including changes in shapes that occur during manufacturing. The features of the embodiments described herein may be combined in various ways as will be apparent to one of ordinary skill in the art.

As described above, in accordance with an industry trend toward producing thinner electronic products, the thickness of an insulating layer included in a circuit board tends to be reduced. The reduction in the thickness of the insulating layer may in turn reduce the characteristic impedance of the circuit board.

To maintain the impedance of the circuit board, the line width or the thickness of a signal line included in the circuit board may be adjusted. However, such modification may cause transmission loss or restrict the layout for a circuit element.

In order to prevent the transmission loss, according to an example of the present disclosure, the impedance of the circuit board may be matched by varying a design of the ground rather than a design of the signal line.

According to another example, a new ground pattern structure capable of significantly reducing a change in characteristic impedance values of a circuit board that may result from changing the position of a signal line is provided.

According to another example, a ground line of the circuit board may be patterned so that the characteristic impedance of the circuit board remain constant regardless of the position of a signal line formed over the ground line.

Although the examples described below have a variety of configurations, other configurations are possible as will be apparent to one of ordinary skill in the art.

Electronic Component

FIG. 1 schematically illustrates an example of a circuit board used in an electronic component. Referring to the example illustrated in FIG. 1, the electronic component corresponds to a camera module, and the circuit board corresponds to a circuit board 300 for the camera module. The circuit board 300 is disposed below a lens assembly 1, a VCM assembly 2, an IR filter 3, and a sensor 4, and is disposed above an ISR module 5. However, FIG. 1 illustrates only an example of the circuit board 300, and the components may be disposed in a different arrangement and configuration from that described above in another example. In addition, other components may be further added or substituted.

The circuit board 300 for the camera module includes a signal transmitting part 320 and a ground part 330. In the illustrated example, the signal transmitting part 320 provides a control signal to the VCM assembly 2, the sensor 4, the ISP module 5, and the like, and includes at least one signal line 321. The signal line 321 serves the purpose of supporting a mobile industry processor interface (MIPI). In this example, the signal line 321 is configured by four pairs of lanes and one clock line; however, the arrangement of the signal line 321 is not limited thereto. For instance, in another example, the signal line 321 may be configured by a single signal line. The ground part 330 provides a ground to the signal line 321 of the signal transmitting part 320, and includes a plurality of conductive patterns 331, 332, and 333.

Figure 2:
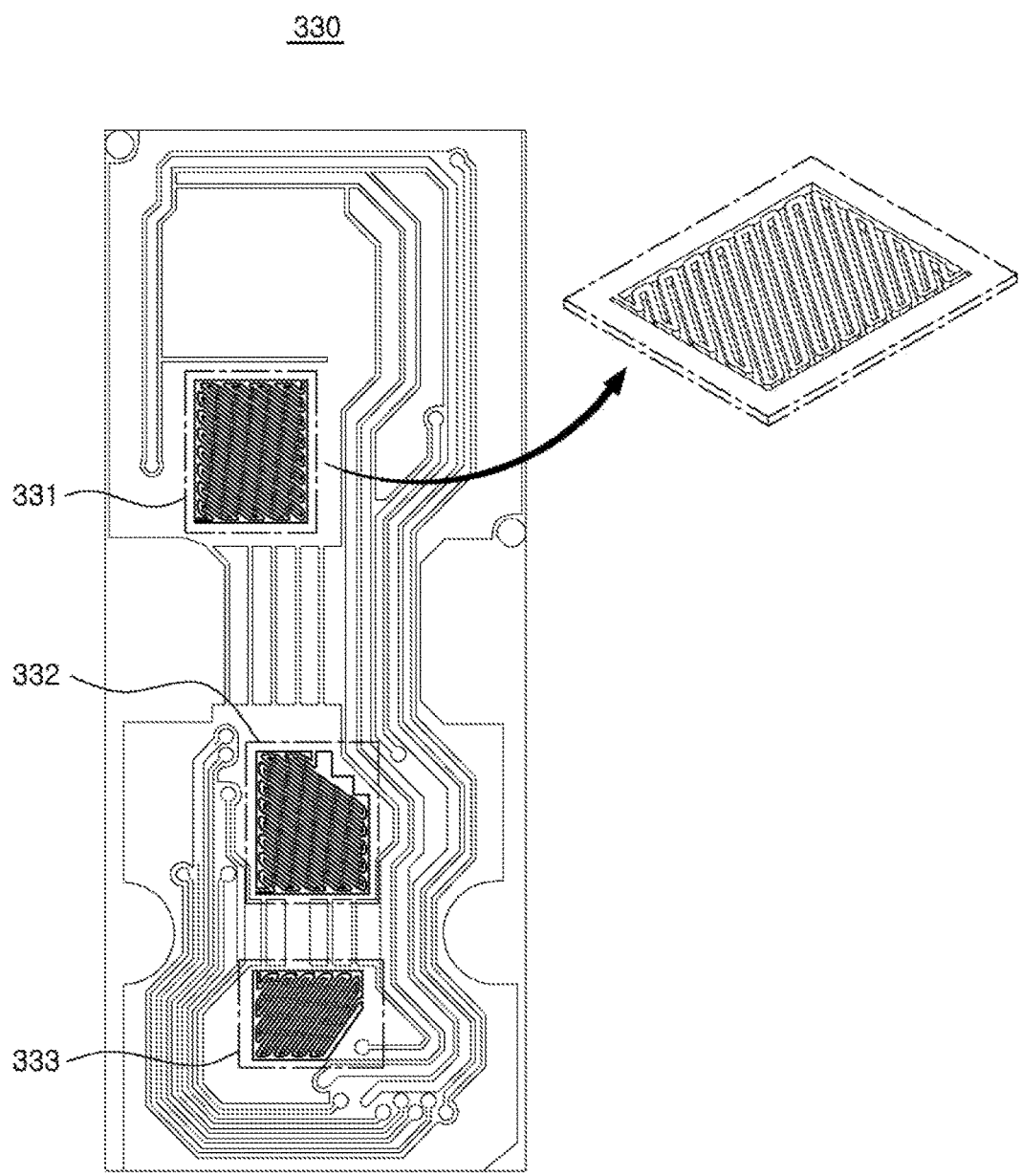
FIG. 2 illustrates a ground part of an example of a circuit board according to FIG. 1.

FIG. 2 illustrates an example of a ground part 330 according to the circuit board illustrated in FIG. 1. In FIG. 2, the ground part 330 includes a plurality of conductive patterns 331, 332, and 333. Referring to the example illustrated in FIG. 2, a first conductive pattern 331 of the ground part 330 is formed on a portion at which the signal line 321 is in contact with the VCM assembly 2. In addition, a second conductive pattern 332 of the ground part 330 is formed below a middle point of the signal line 321. In addition, a third conductive pattern 333 of the ground part 330 is formed at a portion in which the signal line 321 is connected to a control signal line 313 of a sensor mounting part 310 to be described below.

The circuit board 300 for the camera module further includes the sensor mounting part 310 for mounting the sensor 4, as illustrated in FIG. 1. Referring to FIG. 1, the sensor mounting part 310 includes a sensor mounted portion 311, a fourth conductive pattern 312, and the control signal line 313. Further, the circuit board 300 for the camera module includes a connector part 340, as illustrated in FIG. 1. The connector part 340 provides a connection with the outside and may be formed of a rigid material to provide structural support; however, the configuration of the circuit board 300 is not limited thereto.

The circuit board 300 for the camera module may accomplish an impedance matching by the sensor mounting part 310, the signal transmitting part 320, the ground part 330, and the like disposed as described above. For instance, in an example in which shapes of the conductive patterns included in the sensor mounting part 310 and/or the ground part 330 are implemented in a ground pattern shape to be described below, a difference in the values of characteristic impedances resulting from positioning the signal line of the signal transmitting part 320 in different locations may be significantly reduced while maintaining a high characteristic impedance for the circuit board 300. A description thereof will be provided below.

Although FIGS. 1 and 2 describe an example of a circuit board in which the electronic component is a camera module, the circuit board described in the present disclosure is not necessarily applied only to a camera module. Rather, the circuit board may be applied to various other electronic components that include a circuit board. Further, in describing a range of an upper concept, the circuit board may also be applied to other electronic devices including a circuit board.

Examples of other electronic components that include a circuit board include an adapter, an antenna, a cellular FEM, a digital tuner, an LED lighting power, a server power, a TV power, a vibration, a wireless LAN, a wireless power transfer, and like, but the examples are not limited thereto. A circuit board may be applied to other electronic components.

Examples of electronic devices including a circuit board include a smartphone, a personal digital assistant, a digital video camera, a digital still camera, a network system, a computer, a monitor, a tablet, a laptop, a netbook, a television, a video game console, a smart watch, and the like, but the examples are not limited thereto. A circuit board may be applied to other electronic devices.

Circuit Board

Figure 3A:
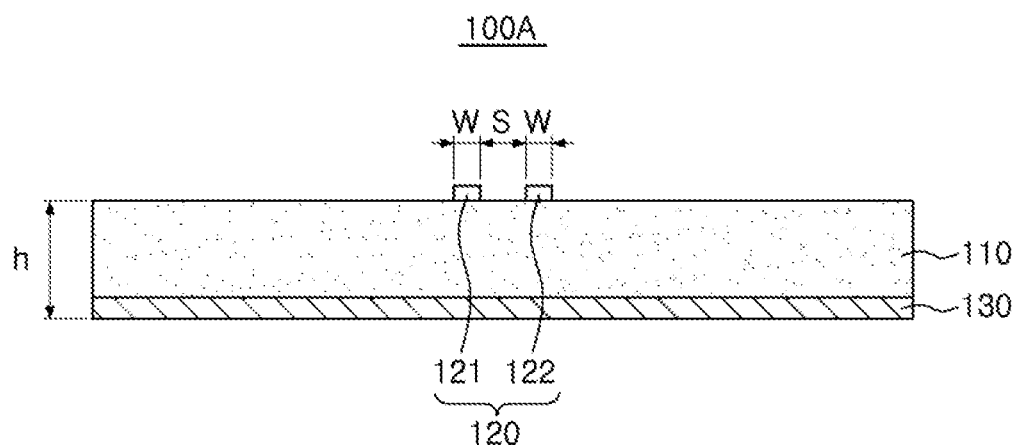
FIG. 3A is a cross-sectional view schematically illustrating an example of a circuit board.
Figure 3B:
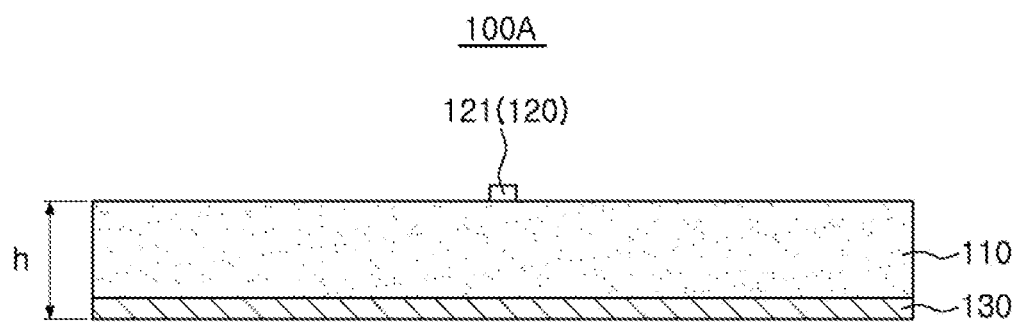
FIG. 3B is a cross-sectional view schematically illustrating another example of a circuit board.

FIGS. 3A and 3B are cross-sectional views schematically illustrating an example of a circuit board 100A. Referring to the example illustrated in FIGS. 3A and 3B, the circuit board 100A includes a first conductive layer 120 and a second conductive layer 130 with a first insulating layer 110 disposed therebetween. The circuit board 100A may be formed of any configuration, provided that the configuration includes the first conductive layer 120 and the second conductive layer 130 with the first insulating layer 110 disposed therebetween. The circuit board 100A according to the illustrated example may be classified into a microstrip circuit board.

The first insulating layer 110 may include a dielectric medium having a suitable dielectric constant to insulate the first conductive layer 120 from the second conductive layer 130. The first insulating layer 110 may have a predetermined height h according to a size of an electronic product to which the first insulating layer 110 is applied. A material that forms the first insulating layer 110 may be selected without limitation as long as the material is an insulating material. For example a thermosetting resin such as an epoxy resin, a thermoplastic resin such as polyimide, or a resin having a reinforcement material such as a glass fiber or an inorganic filler impregnated therein, such as a pre-preg, Ajinomoto build-up film (ABF), FR-4, a bismaleimide triazine (BT) resin, or the like may be used, but the material of the first insulating layer 110 is not limited thereto. The first insulating layer 110 may also include therein a metal having excellent rigidity and thermal conductivity disposed therein. For example, as the metal disposed in the first insulating layer 110, a Fe—Ni based alloy may be used, and Cu plating may also be formed on the surfaces of the Fe—Ni based alloy. However, the composition of the first insulating layer 110 is not limited thereto. In addition to the metal alloy, glasses, ceramics, plastics, and the like may be disposed as particles, fibers, and the like within the first insulating layer 110.

Referring to FIG. 3A, the first conductive layer 120 includes signal lines 121 and 122. The first conductive layer 120 may serve as the signal transmitting part of the circuit board. The signal lines 121 and 122, which are configured to transmit various signals, for example, a control signal, and the like, may be implemented with a pair of signal lines 121 and 122 that are spaced apart from each other by a predetermined distance S while simultaneously having a predetermined width W, as illustrated in FIG. 3A. The pair of signal lines 121 and 122 may be, for example, two lanes supporting a mobile industry processor interface (MIPI), but are not limited thereto. While two signal lines 121 and 122 are illustrated in FIG. 3A, the first conductive layer 120 may include more than two signal lines. Alternatively, the first conductive layer 120 may include only one signal line 121, as illustrated in FIG. 3B. The signal lines 121 and 122 may include at least one material selected from silver (Ag), palladium (Pd), aluminum (Al), nickel (Ni), titanium (Ti), gold (Au), copper (Cu), platinum (Pt), and the like having excellent conductivity, or a mixture of at least two materials thereof. The signal lines 121 and 122 may be formed by a known method. For example, the signal lines 121 and 122 may be formed by electro copper plating, electroless copper plating, or the like. According to an example, the signal lines 121 and 122 are formed using a chemical vapor deposition (CVD) method, a physical vapor deposition (PVD) method, a sputtering method, a subtractive method, an additive method, a semi-additive process (SAP), a modified semi-additive process (MSAP), or the like, but the method is not limited thereto.

The second conductive layer 130 may include a ground line 131. That is, the second conductive layer 130 may serve as the ground part of the circuit board. The ground line 131 serves the purpose of providing grounds of a variety of signals of the signal lines 121 and 122 and provides return paths of various signals at the same time. The configuration of the ground line 131 will be described below. The ground line 131 may include at least one material selected from silver (Ag), palladium (Pd), aluminum (Al), nickel (Ni), titanium (Ti), gold (Au), copper (Cu), platinum (Pt), and the like having excellent conductivity, or a mixture of at least two materials thereof, similar to the signal lines 121 and 122. The ground line 131 may also be formed by a known method, such as electro copper plating, electroless copper plating, or the like. For example, the ground line 131 may be formed using a chemical vapor deposition (CVD) method, a physical vapor deposition (PVD) method, a sputtering method, a subtractive method, an additive method, a semi-additive process (SAP), a modified semi-additive process (MSAP), or the like, but is not limited thereto.

In the circuit board 100A according to an example, an E-field and an H-field may be formed between the signal lines 121 and 122 of the first conductive layer 120 and the ground line 131 of the second conductive layer 130. In this case, characteristic impedance may be influenced by the formed E-field and H-field.

Figure 4A:
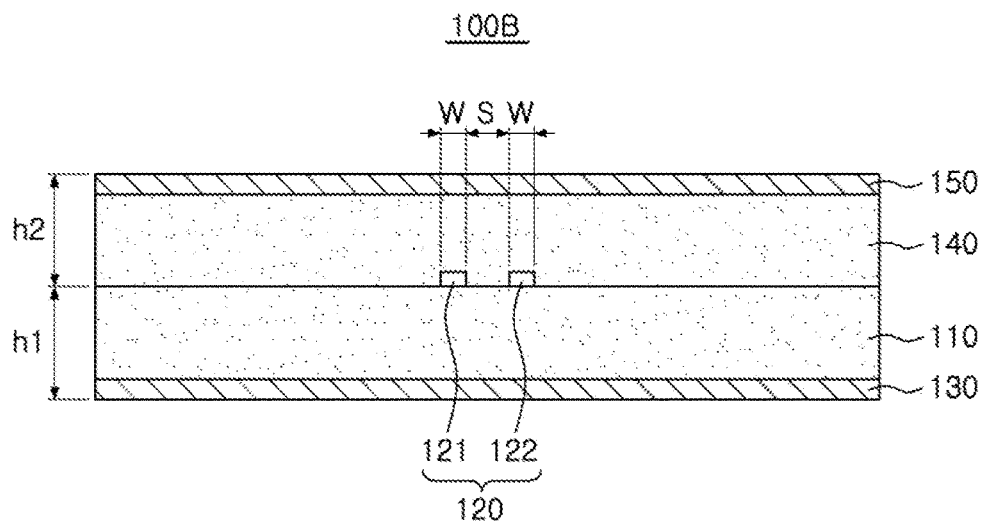
FIG. 4A is a cross-sectional view schematically illustrating another example of a circuit board.
Figure 4B:
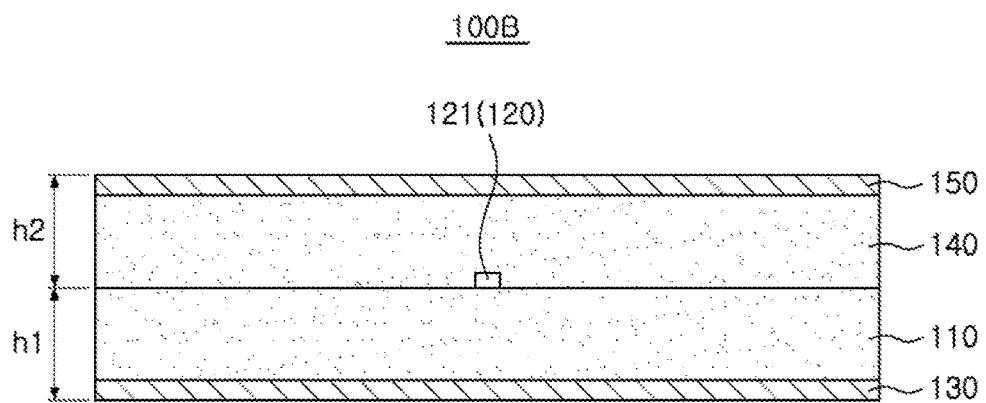
FIG. 4B is a cross-sectional view schematically illustrating yet another example of a circuit board.

FIGS. 4A and 4B are cross-sectional views schematically illustrating additional examples of circuit boards 100B. Referring to FIGS. 4A and 4B, a circuit board 100B includes a first conductive layer 120 and a second conductive layer 130 with a first insulating layer 110 disposed therebetween. In addition, a second insulating layer 140 is disposed between the first conductive layer 120 and a third conductive layer 150. The circuit board 100B according to this example may be modified to have different configurations, provided that the circuit board 10B includes a first conductive layer 120, a second conductive layer 130, and a third conductive layer 150 with a first insulating layer 110 disposed between the first and second conductive layers 120, 130 and a second insulating layer 140 disposed between the first and the third conductive layers 120, 150. A circuit board 100B having such a configuration may be classified as a stripline circuit board.

The first insulating layer 110 includes a dielectric medium having a dielectric constant as described above, and has a predetermined height h1 determined according to the size of the electronic product to which the first insulating layer 110 is applied. A material for the first insulating layer 110 may be selected without limitation as long as the material is an insulating material. For example a thermosetting resin such as an epoxy resin, a thermoplastic resin such as polyimide, or a resin having a reinforcement material such as a glass fiber or an inorganic filler impregnated therein, such as a pre-preg, Ajinomoto build-up film (ABF), FR-4, a bismaleimide triazine (BT) resin, or the like may be used, but the material of the first insulating layer 110 is not limited thereto. The first insulating layer 110 may also include a metal having excellent rigidity and thermal conductivity disposed therein as particles. A Fe—Ni based alloy may be, for example, used to form particles, and Cu plating may also be formed on the surfaces on the Fe—Ni based alloy particles. In addition, glasses, ceramics, plastics, and the like may be also disposed in the first insulating layer 110 or disposed in the first insulating layer 110 instead of the metal particles.

The second insulating layer 140 may include a dielectric medium having a dielectric constant similar to the first insulating layer 110, and may have a height h2 predetermined according to a size of a product to which the second insulating layer 140 is applied. A material of the second insulating layer 140 may also be selected without limitation as long as the material is an insulating material. For example, a thermosetting resin such as an epoxy resin, a thermoplastic resin such as polyimide, or a resin having a reinforcement material such as a glass fiber or an inorganic filler impregnated therein, such as a pre-preg, Ajinomoto build-up film (ABF), FR-4, a bismaleimide triazine (BT) resin, or the like may be used, but the material of the second insulating layer 140 is not limited thereto. The second insulating layer 140 may also have a metal having excellent rigidity and thermal conductivity disposed therein. According to an example, as the metal, a Fe—Ni based alloy may be used, and Cu plating may also be formed on the surface on the Fe—Ni based alloy. Besides the metal, other materials such as glasses, ceramics, plastics, and the like may be disposed in the second insulating layer 140.

Referring to FIG. 4A, the first conductive layer 120 includes signal lines 121 and 122 as described above. That is, the first conductive layer 120 may serve as the signal transmitting part of the circuit board. The signal lines 121 and 122 may transmit various signals, for example, a control signal, and the like, and may include a pair of signal lines 121 and 122 that are spaced apart from each other by a predetermined distance S while having a predetermined width W at the same time, as illustrated in FIG. 4A. The pair of signal lines 121 and 122 may be, for example, two lanes supporting a mobile industry processor interface (MIPI), but are not limited thereto. In another example, however, the first conductive layer 120 may include more than two signal lines. Alternatively, the first conductive layer 120 may include only a single signal line 121, as illustrated in FIG. 4B. The signal lines 121 and 122 may include at least one material selected from silver (Ag), palladium (Pd), aluminum (Al), nickel (Ni), titanium (Ti), gold (Au), copper (Cu), platinum (Pt), and the like having excellent conductivity, or a mixture of at least two materials thereof. The signal lines 121 and 122 may be formed by a known method. For example, the signal lines 121 and 122 may be formed by electro copper plating, electroless copper plating, or the like. According to an example, the signal lines 121 and 122 may be formed using a chemical vapor deposition (CVD) method, a physical vapor deposition (PVD) method, a sputtering method, a subtractive method, an additive method, a semi-additive process (SAP), a modified semi-additive process (MSAP), or the like, but the method of forming the signal lines 121 and 122 is not limited thereto.

The second conductive layer 130 may include a ground line 131 as described above. That is, the second conductive layer 130 may serve as the ground part of the circuit board. The purpose of the ground line 131 is to provide grounds of a variety of signals of the signal lines 121 and 122 and provide return paths of the variety of signals at the same time. A configuration of the ground line 131 will be described below. The ground line 131 may include at least one material selected from silver (Ag), palladium (Pd), aluminum (Al), nickel (Ni), titanium (Ti), gold (Au), copper (Cu), platinum (Pt), and the like having excellent conductivity, or a mixture of at least two materials thereof, similar to the signal lines 121 and 122. The ground line 131 may be formed by a known method. For example, the ground line 131 may be formed by electro copper plating, electroless copper plating, or the like. According to an example, the ground line 131 may be formed using a chemical vapor deposition (CVD) method, a physical vapor deposition (PVD) method, a sputtering method, a subtractive method, an additive method, a semi-additive process (SAP), a modified semi-additive process (MSAP), or the like, but the method of forming the ground line 131 is not limited thereto.

The third conductive layer 150 may include a ground line similar to the second conductive layer 120. That is, the third conductive layer 150 may also serve as the ground part. The purpose of the ground line is also to provide grounds of various signals of the signal lines 121 and 122 and provide return paths of the various signals at the same time. A configuration of the ground line will be described below. The ground line may similarly include at least one material selected from silver (Ag), palladium (Pd), aluminum (Al), nickel (Ni), titanium (Ti), gold (Au), copper (Cu), platinum (Pt), and the like having excellent conductivity, or a mixture of at least two materials thereof. The ground line may be formed by a known method, such as electro copper plating, electroless copper plating, or the like. According to an example, the ground line may be formed using a chemical vapor deposition (CVD) method, a physical vapor deposition (PVD) method, a sputtering method, a subtractive method, an additive method, a semi-additive process (SAP), a modified semi-additive process (MSAP), or the like, but the method is not limited thereto.

In the circuit board 100B according to another example, an E-field and an H-field may be formed between the signal lines 121 and 122 of the first conductive layer 120 and the ground line 131 of the second conductive layer 130, and between the signal lines 121 and 122 of the first conductive layer 120 and the ground line 131 of the second conductive layer 130. In this example, characteristic impedance may be influenced by the formed E-field and H-field.

Figure 5:
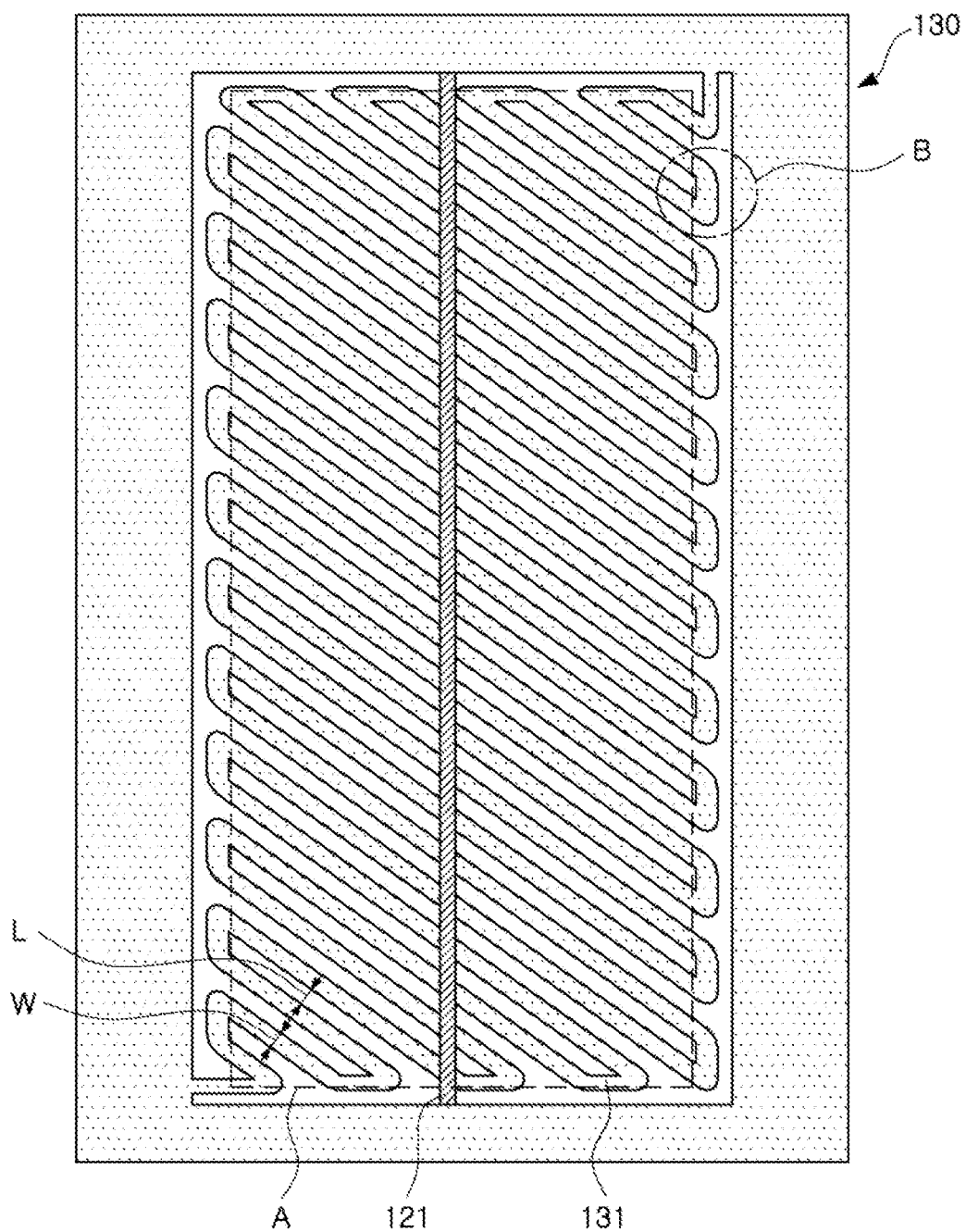
FIG. 5 is a plan view schematically illustrating an example of a conductive layer having a ground line.

FIG. 5 is a plan view schematically illustrating an example of the second conductive layer 130. Referring to FIG. 5, the second conductive layer 130 includes the ground line 131, which is a conductive path in which a plurality of conductive patterns are connected to each other. The ground line 131 includes an area A corresponding to an area where the signal line 121 is provided. According to this example, in the corresponding area A, the impedance of the circuit board is matched by a pattern design of the ground line 131, rather than by forming the signal line 121 according to a pattern design. In FIG. 5, only one signal line 121 is illustrated for convenience, but the number of signal lines in the corresponding area A is not limited thereto. For example, a plurality of signal lines may be provided in the corresponding area A. Further, the signal line 121 may be repositioned within the corresponding area A or be bent or curved in the corresponding area A.

In this example, unit patterns having an opened curve shape are disposed on an edge portion B of the ground line 131, and inner unit patterns having an obliquely inclined shape are disposed between the outer unit patterns having the opened curve shape disposed along the edge portion B. The above-mentioned unit patterns are connected to each other to form a return path for a variety of signals transferred through the signal line 121. In this example, the ground line 131 is thus patterned in an oblique meander shape. Thereby, a difference of values of characteristic impedances that may result from changing the position of the signal line in the corresponding area A may be significantly reduced while maintaining the characteristic impedance of the circuit board.

As described above, the impedance characteristics of the circuit board is typically determined by a line width W and a thickness T of the signal line 121, a height between the signal line 121 and the ground line 131, a dielectric constant of a medium configuring the insulating layer 110, and the like. However, in accordance with a trend toward producing thinner electronic products, the thickness T of the insulating layer 110 may be reduced when a circuit board is being designed. Thus, the impedance of the circuit board may become reduced beyond a desired value. To ameliorate the reduction of impedance, the line width W or the thickness T of the signal line 121 may be adjusted. However, in the event that the line width W or the thickness T of the signal line 121 is adjusted to control the impedance of the circuit board, a transmission loss may inevitably occur. Further, when the line width W and the thickness T of the signal line 121 are adjusted to control the impedance, the freedom to design a layout of circuit elements is significantly compromised.

According to an example, a method of matching impedance of the circuit board by varying a design of the ground line 131, rather than a design of the signal line 121, is provided. In this example, to significantly reduce the difference in the characteristic impedances resulting from changing the position of a signal line while maintaining the high characteristic impedance of a circuit board, the ground line 131 is patterned in an oblique meander shape. Because forming the ground line 131 in an oblique meander shape allows the return path of the ground line 131 to be longer than the return path of the signal line 121, the ground line 131 may exhibit high impedance characteristics. In addition, because a pattern shape of the corresponding ground line 131 is constantly maintained regardless of the exact position of the signal line 121 in the corresponding area A, the difference of the characteristic impedances that results from repositioning the signal line 121 within the corresponding area A may be significantly reduced. Therefore, the impedance mismatching may be substantially eliminated in the corresponding area A of a circuit board.

The unit patterns having an opened curve shape that are disposed on the edge portion B of the ground line 131 may serve to connect the inner unit patterns disposed therebetween to each other. According to an example, because the outer unit patterns having the opened curve shape are disposed along all edge portions (a top, a bottom, a left, and a right) of the ground line 131, the space utility of the ground line 131 may be increased by forming the unit patterns having an obliquely inclined shape. As a result, a ground pattern 131 having a longer path than the signal line 121 may be obtained. Referring to FIG. 5, to form a ground pattern 131 having the elongated path, the ground pattern 131 includes a pattern area formed in a meander shape so that the conductive path of the ground pattern 131 passes across the signal line 121 several times in a plan view of the circuit board. The precise shape of the unit patterns having the opened curve shape is not limited to the illustrated example, and a different shape may be used as long as the unit patterns having the opened curve shape is disposed on the edge portion B to connect the unit patterns having the stripe shape disposed therebetween to each other in an oblique angle with respect to the signal line 121.

Since the unit patterns having the obliquely inclined shape disposed between the unit patterns having the opened curve shape disposed on the edge portion B have high space utility, the unit patterns having the obliquely inclined shape allows the ground line 131 to have a longer path. Accordingly, high impedance characteristics may be implemented. In this example, the unit patterns having the obliquely inclined shape have a constant line width W, and also have a constant interval L therebetween. Further, the unit patterns having the obliquely inclined shape may include a plurality of conductive stripes that are aligned along substantially the same direction to each form substantially the same angle with the signal line 121. Accordingly, the pattern shape of the unit patterns having the obliquely inclined shape is constantly maintained in the corresponding area A regardless of the position of the signal line 121. Thus, even when the signal line is repositioned to a different location of the corresponding area A, the impedances may be maintained to be substantially the same.

A value for the line width W or the interval L of the unit patterns having the obliquely inclined shape is not particularly limited, and may be designed to obtain the desired impedance. For example, the impedance of the circuit board may be decreased by increasing the line width W, as needed. Similarly, the value of a gradient of the unit patterns having the obliquely inclined shape is also not particularly limited, and any unit patterns having the obliquely inclined shape may be used as long as the unit patterns are constantly and obliquely inclined.

Figure 6:
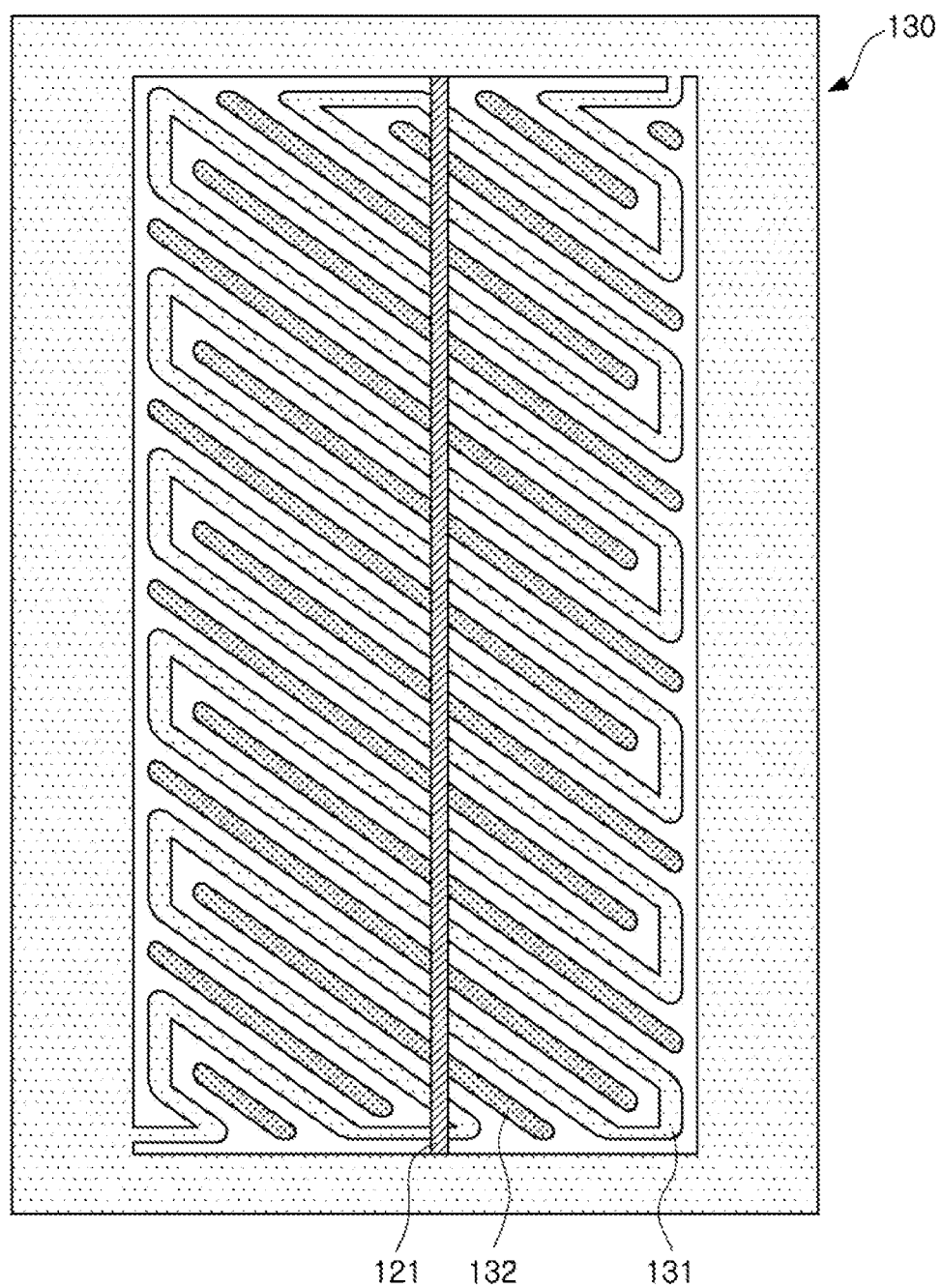
FIG. 6 is a plan view schematically illustrating an example in which a dummy pattern is applied to a conductive layer having a ground line according to FIG. 5.
Figure 7:
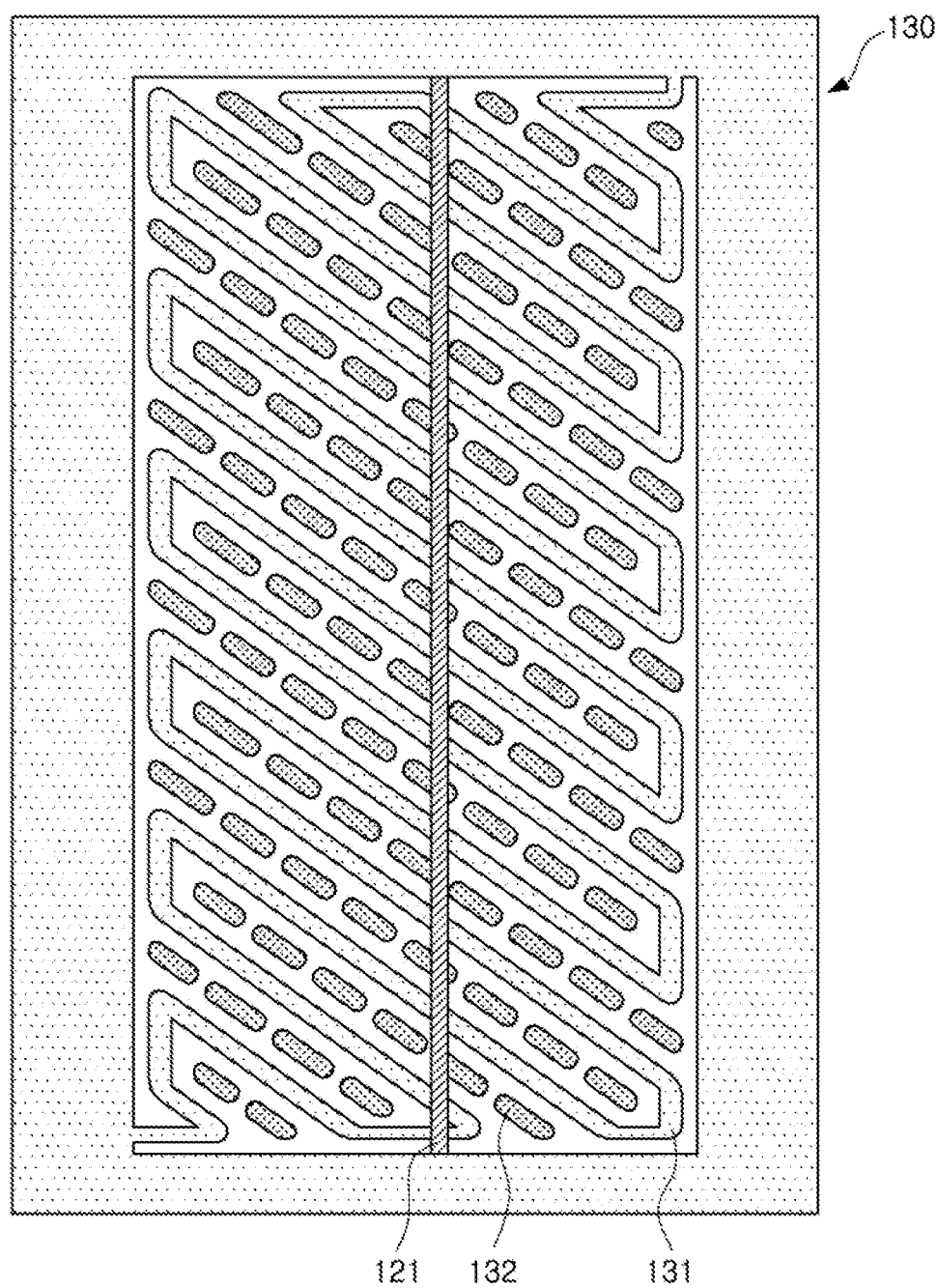
FIG. 7 is a plan view schematically illustrating another example in which a dummy pattern is applied to a conductive layer having a ground line according to FIG. 5.

FIGS. 6 and 7 are plan views schematically illustrating examples of ground lines in which dummy patterns 132 of various configurations are applied to the second conductive layer 130. In general, in a case in which an interval of the ground line 131 is increased, the impedance of the circuit board may be increased; however, an electromagnetic interference (EMI) emission may occur due to the increased interval. As a result, the EMI emission may cause interference in other signal lines. Referring to the example illustrated in FIG. 6, a plurality of dummy patterns 132 that are not connected to the ground line 131 are disposed between the intervals of the ground line 131. Thus, the EMI emission may be shielded while maintaining the impedance. Further, because a conductive ratio of the second conductive layer 130 may be adjusted by the plurality of dummy patterns 132, warpage may also be controlled.

Herein, a layout, a shape, a width, an interval, or the like of the dummy pattern 132 is not limited to the illustrated example, and may be modified as long as the plurality of dummy patterns 132 do not interfere with an overall layout of the ground line 131. For example, referring an example illustrated in FIG. 6, a dummy pattern 132 is disposed between the respective intervals of the ground line 131 while the ground line 131 forms an oblique meander shape. On the other hand, in FIG. 7, a plurality of dummy patterns 132 are disposed between the respective intervals of the ground line 131.

The plurality of dummy patterns 132 may include at least one material selected from silver (Ag), palladium (Pd), aluminum (Al), nickel (Ni), titanium (Ti), gold (Au), copper (Cu), platinum (Pt), and the like having excellent conductivity, or a mixture of at least two materials thereof. The dummy pattern 132 may be formed by a known method, such as electro copper plating, electroless copper plating, or the like. According to one example, the dummy pattern 132 is formed using a method such as a chemical vapor deposition (CVD) method, a physical vapor deposition (PVD) method, a sputtering method, a subtractive method, an additive method, a semi-additive process (SAP), a modified semi-additive process (MSAP), or the like, but the method of forming the dummy pattern 132 is not limited thereto.

Figure 8:
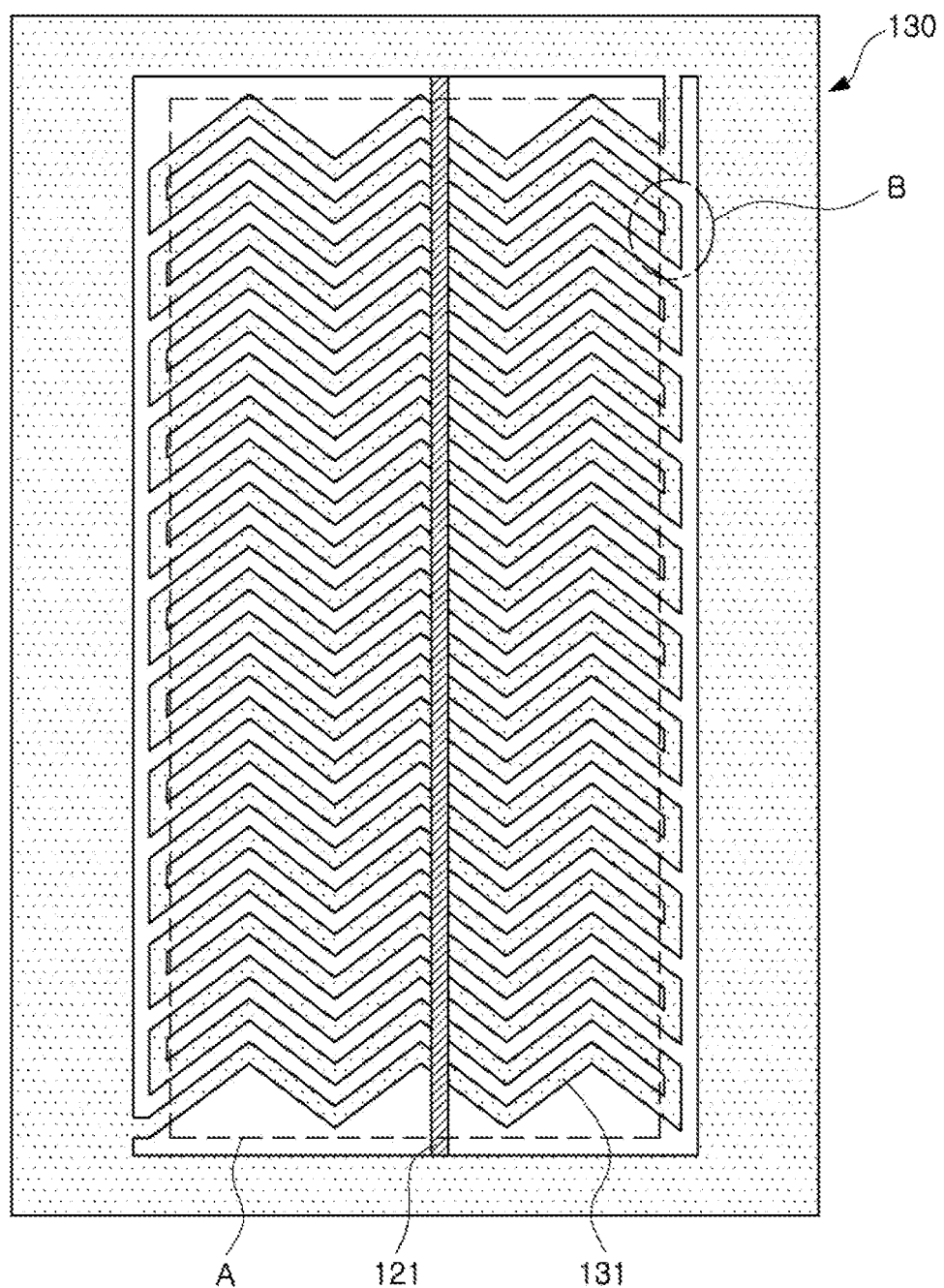
FIG. 8 is a plan view schematically illustrating another example of a conductive layer having a ground line.

FIG. 8 is a plan view schematically illustrating another example of the second conductive layer 130. In this example, the second conductive layer 130 includes the ground line 131, which is a conductive path in which a plurality of conductive patterns are connected to each other. Further, the ground line 131 includes an area A that corresponds to an area in which the signal line 121 is provided. Further, in the corresponding area A, the impedance of the circuit board is matched by forming the ground line 131 according to a pattern design while the signal line 121 is formed without a pattern design for controlling the impedance. Only a single signal line 121 corresponding to the ground line 131 is illustrated in FIG. 8 for convenience; however, the number of signal lines is not limited thereto. For example, there may be a plurality of signal lines, or the signal line 121 may be repositioned within the corresponding area A.

Referring to FIG. 8, unit patterns having an opened bracket shape are disposed along an edge portion B of the ground line 131, and unit patterns having an obliquely inclined shape that are arranged to from a zigzag shape are disposed between the unit patterns having the opened bracket shape. The above-mentioned unit patterns are connected to each other to form a return path for various signals transferred through the signal line 121. That is, the ground line 131 according to FIG. 8 is patterned in a meander shape. Thereby, a difference in the characteristic impedance values that results when the position of the signal line is changed within the corresponding area A may be significantly reduced while maintaining the desired characteristic impedance.

The unit patterns having the opened bracket shape disposed on the edge portion B serve as a type of a connection part that connects the unit patterns disposed therebetween to each other. In another example, the unit patterns having the opened bracket shape may be disposed on only some of the edges (a left and a right) of the ground line 131 in the relation to the drawing. Also, a shape of the unit patterns having the opened bracket shape is not limited to the illustrated example, and a different shape may be used as long as the unit patterns having the opened bracket shape may be disposed on the edge portion B to connect the inner unit patterns having an obliquely inclined shape to form a zigzag shape, thereby forming a meander shape conductive path.

Because the inner unit patterns having the obliquely inclined shape disposed between the outer unit patterns having the opened bracket shape disposed along the edge portion B increases the space utility of the conductive path in a compact space, the unit patterns having the obliquely inclined shape allow a longer conductive path to be obtained as the ground line 131. Accordingly, a circuit board with high impedance characteristics may be implemented within a compact space. In an example, unit patterns having an obliquely inclined shape may be obliquely inclined in a constant zigzag shape. The unit patterns having the obliquely inclined shape arranged in the zigzag shape may have a constant line width W, and may also have a constant interval L therebetween. As such, because the pattern shape of the unit patterns having the obliquely inclined shape substantially corresponding to the signal line 121 is constantly maintained regardless of the position of the signal line 121, the difference of the impedances that may result from changing the position of the signal line may be significantly reduced.

Herein, a value of the line width W or the interval L of the unit patterns having the obliquely inclined shape is not particularly limited, and may be designed based on the desired impedance value. For example, the impedance may be decreased by increasing the line width W. Further, a value of a gradient of the unit patterns having the obliquely inclined shape is also not particularly limited, and a different unit pattern having an obliquely inclined shape may be used as long as the unit patterns are constantly and obliquely inclined.

Figure 9:
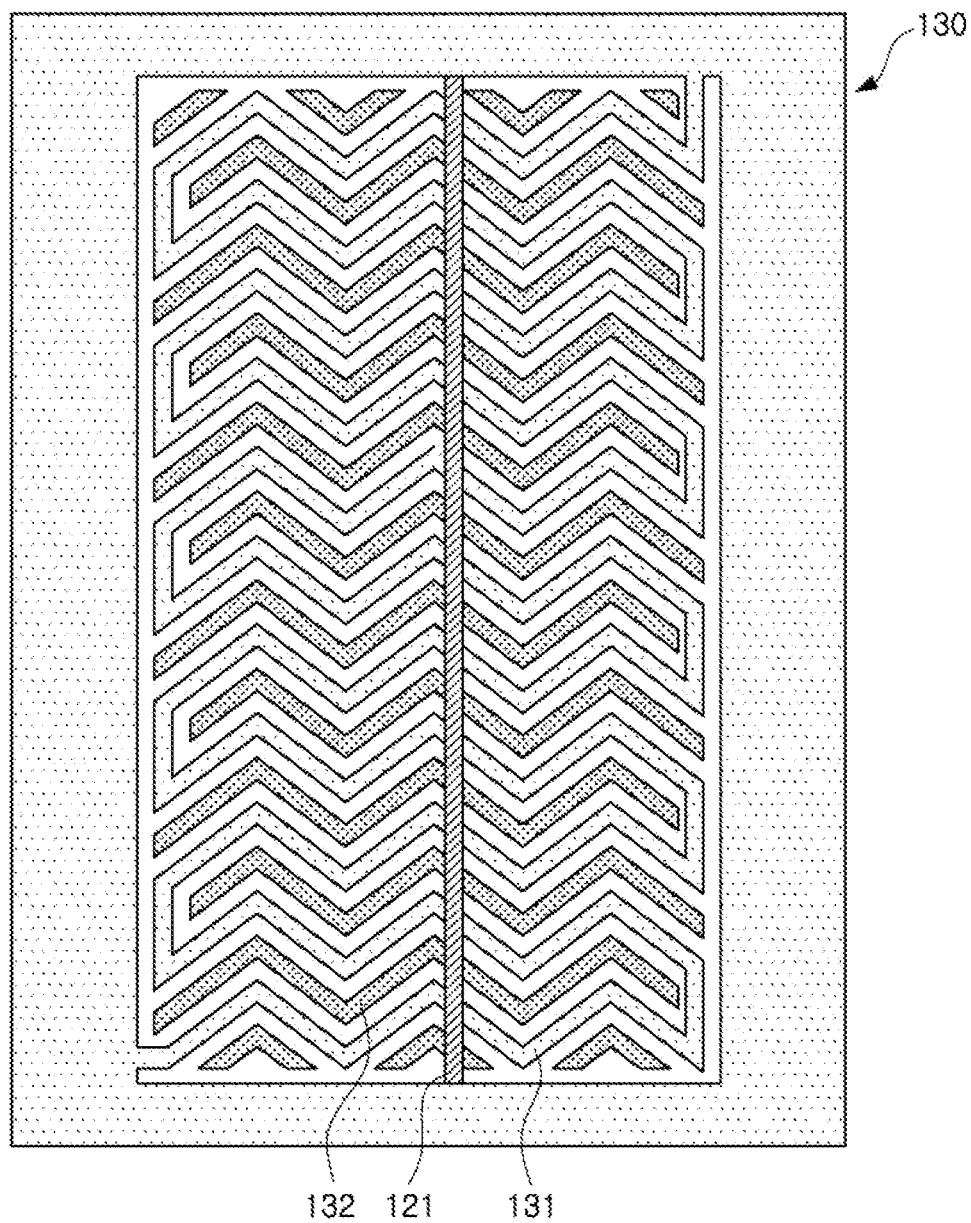
FIG. 9 is a plan view schematically illustrating an example in which a dummy pattern is applied to a conductive layer having a ground line according to FIG. 8.
Figure 10:
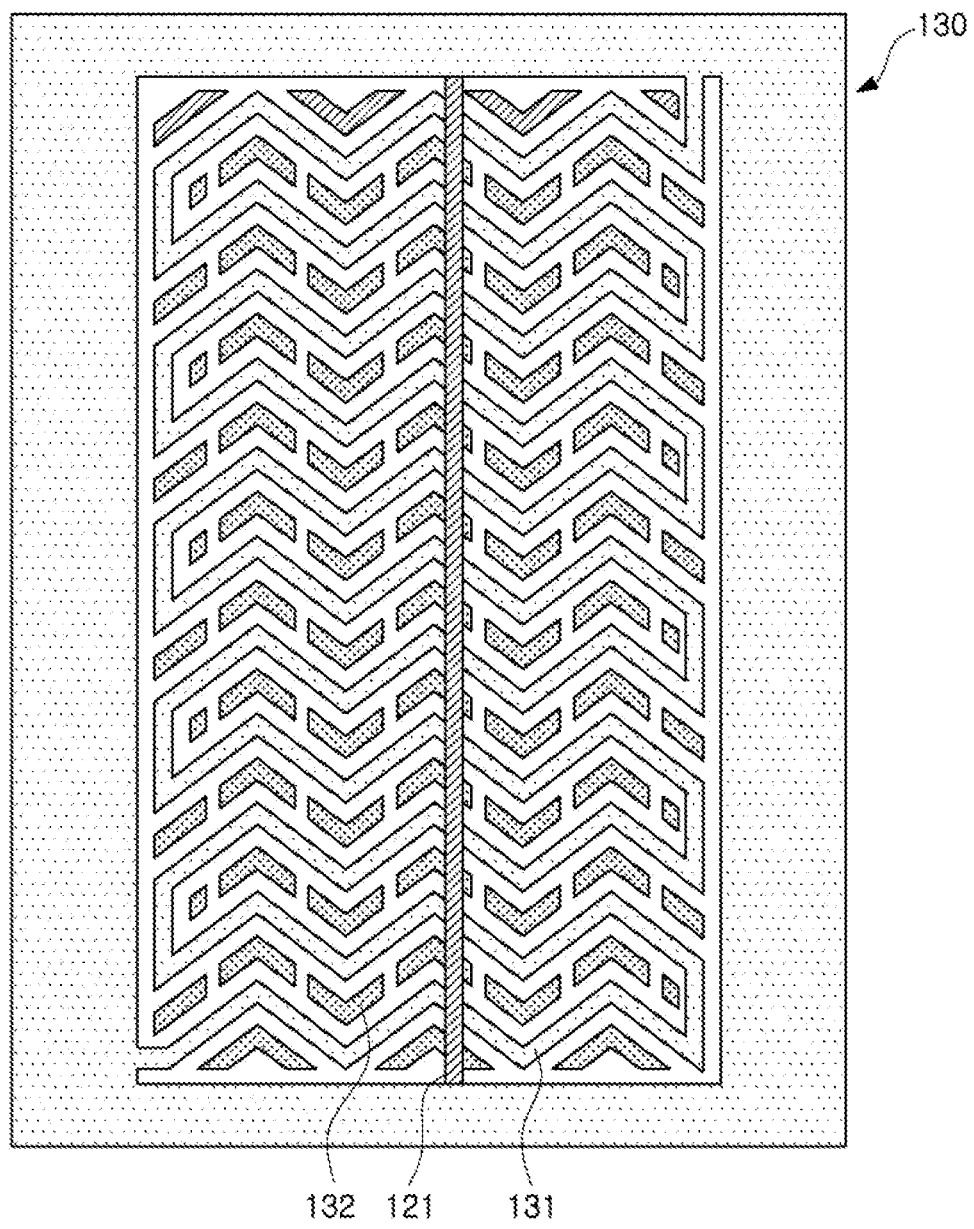
FIG. 10 is a plan view schematically illustrating another example in which a dummy pattern is applied to a conductive layer having a ground line according to FIG. 8.

FIGS. 9 and 10 are plan views schematically illustrating additional examples of circuit boards in which dummy patterns 132 of various shapes are applied to the second conductive layer 130. In the second conductive layer 130 according to the illustrated examples, a plurality of dummy patterns 132 that are not connected to the ground line 131 are disposed between the intervals of the ground line 131, and the EMI emission may be shielded while maintaining the impedance. Further, because a conductive ratio of the second conductive layer 130 may be adjusted by the plurality of dummy patterns 132, warpage of the circuit board may also be controlled.

Herein, provided that the plurality of dummy patterns 132 do not interfere with a layout of the ground line 131 described above, a layout, a shape, a width, an interval, or the like of the dummy pattern 132 may be modified. For example, in FIG. 9, one dummy pattern 132 is disposed between the respective intervals of the ground line 131, and in FIG. 10, a plurality of dummy patterns 132 are disposed between the respective intervals of the ground line 131.

The plurality of dummy patterns 132 may include at least one material selected from silver (Ag), palladium (Pd), aluminum (Al), nickel (Ni), titanium (Ti), gold (Au), copper (Cu), platinum (Pt), and the like having excellent conductivity, or a mixture of at least two materials thereof. The dummy pattern 132 may also be formed by a known method, such as electro copper plating, electroless copper plating, or the like. For example, the dummy pattern 132 may be formed using a method such as a chemical vapor deposition (CVD) method, a physical vapor deposition (PVD) method, a sputtering method, a subtractive method, an additive method, a semi-additive process (SAP), a modified semi-additive process (MSAP), or the like, but the method is not limited thereto.

Figure 11:
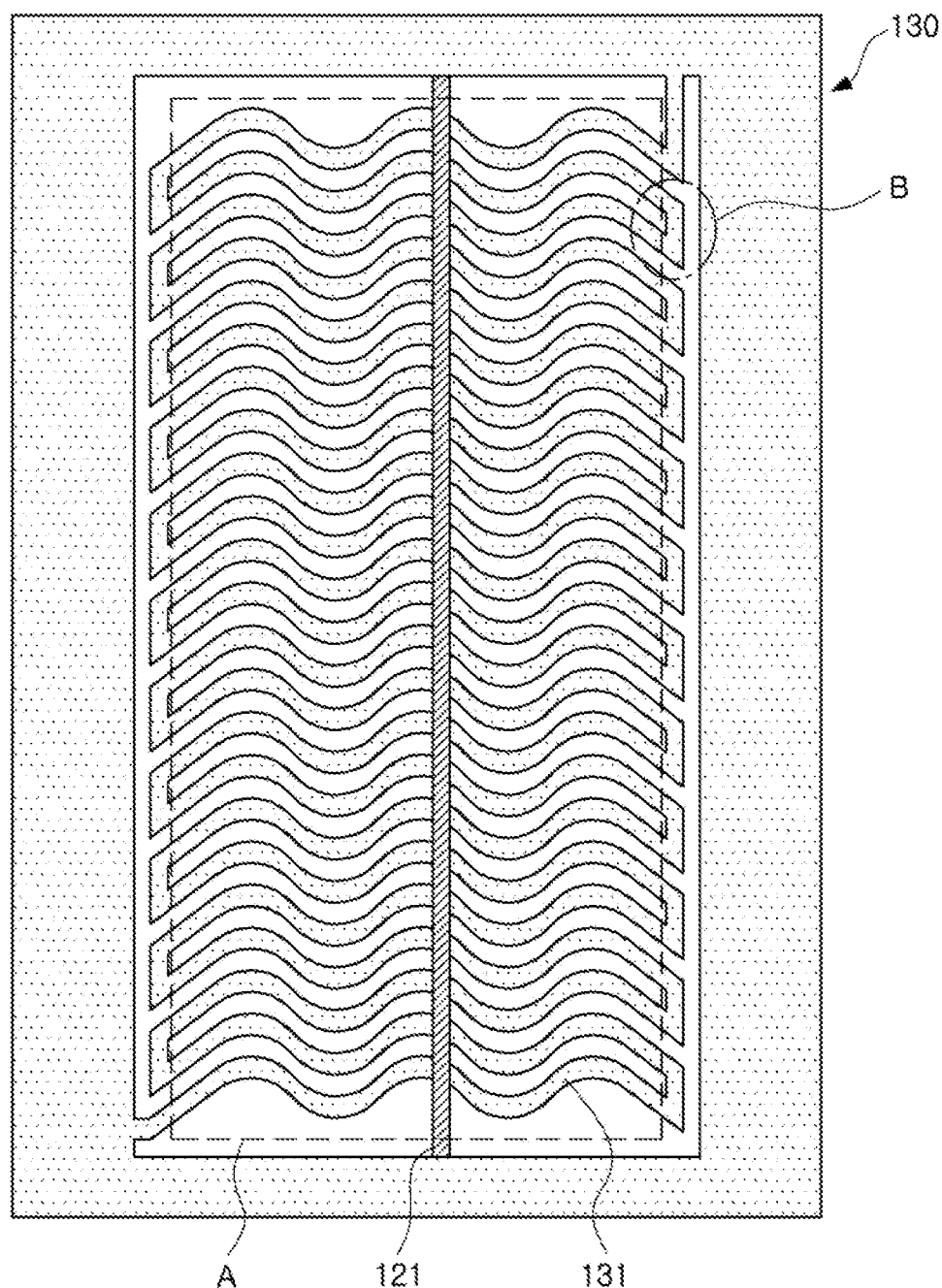
FIG. 11 is a plan view schematically illustrating another example of the conductive layer having the ground line.

FIG. 11 is a plan view schematically illustrating another example of a second conductive layer 130. In this example, the second conductive layer 130 includes the ground line 131, which is a conductive path in which a plurality of conductive patterns are connected to each other to form a return path. Further, the ground line 131 includes an area A corresponding to an area in which a signal line 121 is provided. In the corresponding area A, the impedance of the circuit board may be matched by a pattern design of the ground line 131, not by a pattern design of the signal line 121. Further, while a single signal line 121 corresponding to the ground line 131 is illustrated in FIG. 11 for convenience, the number of signal lines is not limited thereto. For example, there may be a plurality of signal lines.

Unit patterns having an opened bracket shape are disposed on an edge portion B of the ground line 131, and unit patterns having a curved wave shape with obliquely inclined portions are disposed between the unit patterns having the opened bracket shape disposed along the edge portion B. The above-mentioned unit patterns are connected to each other to form a return path for a variety of signals transferred through the signal line 121. That is, the ground line 131 is also patterned in a meander shape. Thereby, a difference in the characteristic impedances resulting from changing the position of the signal line may be significantly reduced while maintaining the characteristic impedance of the circuit board within a desired range.

The unit patterns having the opened bracket shape disposed on the edge portion B may similarly serve as a kind of a connection part connecting the unit patterns disposed therebetween to each other. In this example, the unit patterns having the opened bracket shape are disposed on only some edges (a left and a right) of the ground line 131 in relation to the drawing. However, the shape of the unit patterns having the opened bracket shape is not limited thereto, and unit patterns having a different shape may be used as long as the unit patterns having the opened bracket shape are disposed along the edge portion B to connect the inner unit patterns disposed therebetween.

Because the unit patterns having a curved wave shape disposed between the unit patterns having the opened bracket shape disposed on the edge portion B have high space utility, the unit patterns having curved wave shape may allow a longer path of the ground line 131 to be implemented in a compact space. Accordingly, high impedance characteristics may be implemented. In this example, the unit patterns having a curved wave shape include portions that are obliquely inclined with respect to the signal line 121 such that the conductive path forms a curved zigzag shape. In this example, the unit patterns having the curved zigzag shape have a constant line width W, and also have a constant interval L therebetween. Because the pattern shape of the unit patterns having the obliquely inclined portion is substantially constantly where the signal line 121 overlaps with the ground line 131 regardless of the exact position of the signal line 121, the impedance values obtained by varying the position of the signal line in the corresponding area A are similar. Thus, a change in the impedance value resulting from repositioning the signal line may be significantly reduced.

Similarly, a value for the line width W or the interval L of the unit patterns having the obliquely inclined shape is not particularly limited, and may be determined based on the desired impedance value. For example, the impedance of the circuit board may be decreased by increasing the thickness of the line width W. Further, a value of a gradient of the inner unit patterns having a curved wave shape having obliquely inclined portions is also not particularly limited, and unit patterns having a different shape may be used as long as the unit patterns exhibit constantly and obliquely inclined portions aligned to conform to the angle of the neighboring unit patterns.

Figure 12:
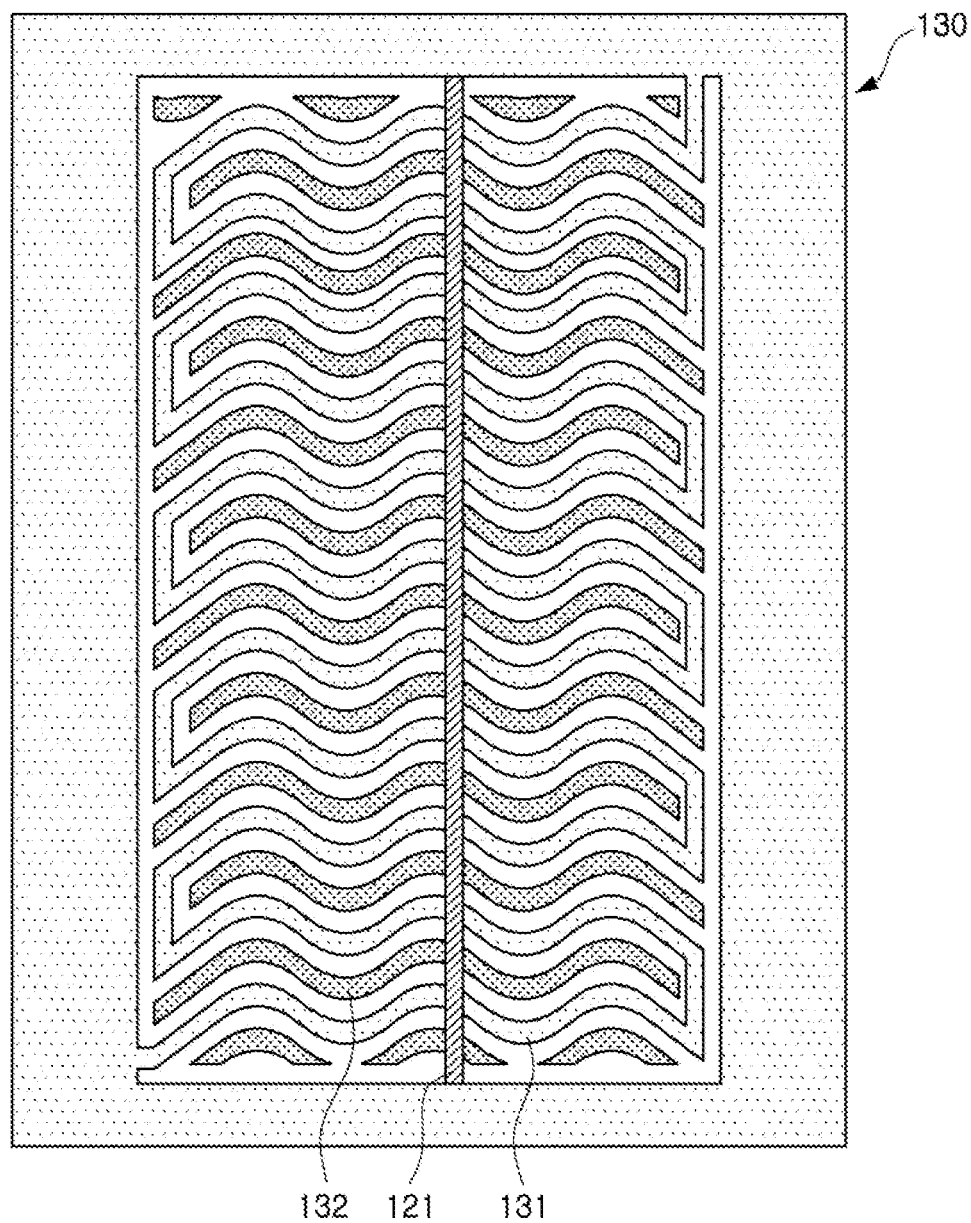
FIG. 12 is a plan view schematically illustrating an example in which a dummy pattern is applied to a conductive layer having a ground line according to FIG. 11.
Figure 13:
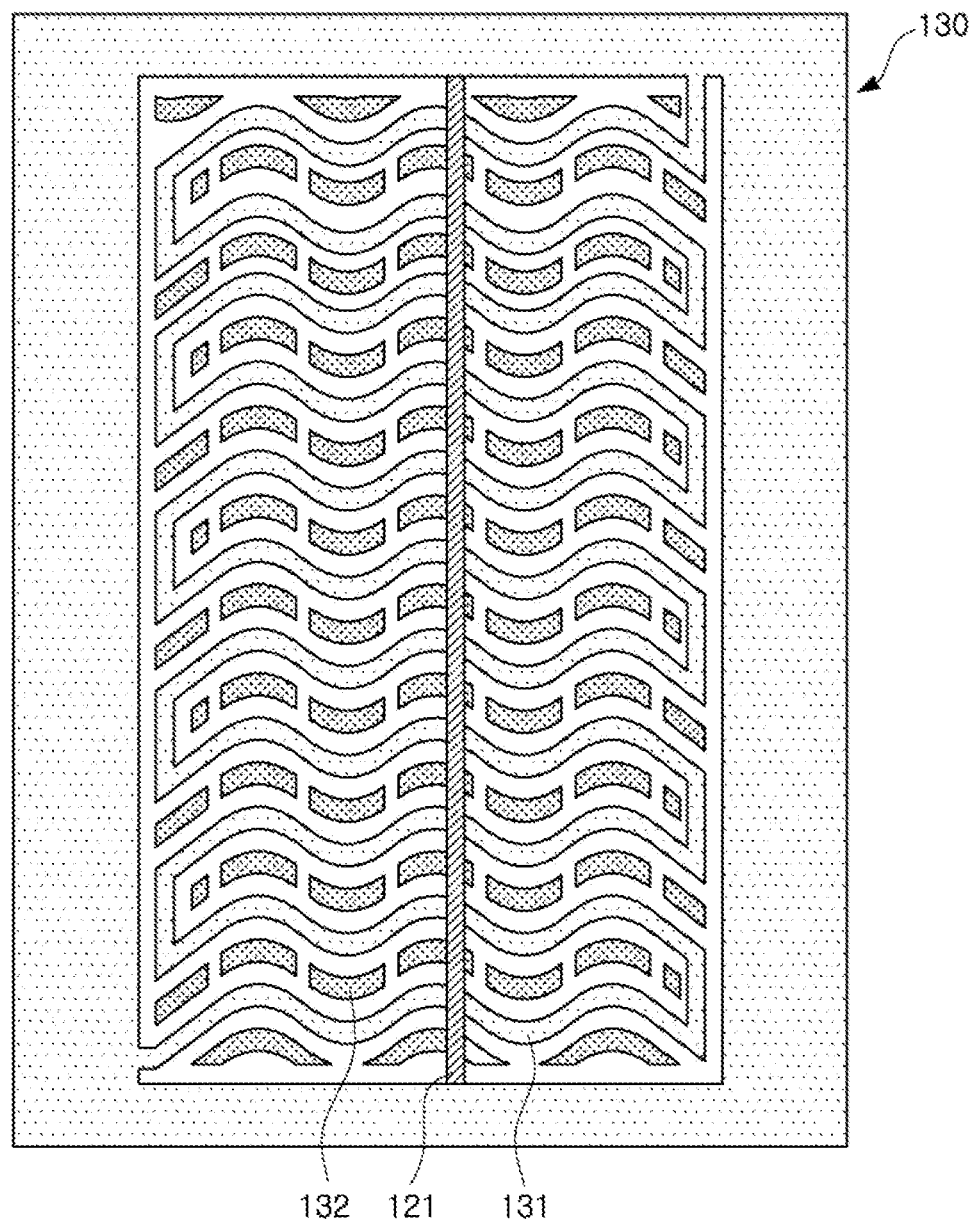
FIG. 13 is a plan view schematically illustrating another example in which a dummy pattern is applied to a conductive layer having a ground line according to FIG. 11.

FIGS. 12 and 13 are plan views schematically illustrating additional examples of circuit boards in which dummy patterns 132 of various shapes are applied to the second conductive layer 130. In the examples of second conductive layers 130 illustrated in FIGS. 12 and 13, a plurality of dummy patterns 132 that are not connected to the ground line 131 are disposed between the intervals of the ground line 131. Thus, the EMI emission may be shielded while maintaining the impedance. Further, because a conductive ratio of the second conductive layer 130 may be adjusted by the plurality of dummy patterns 132, warpage of the circuit board may also be controlled.

Similarly, as long as the plurality of dummy patterns 132 do not interfere with an overall layout of the ground line 131 described above, a layout, a shape, a width, an interval, or the like of the dummy pattern 132 is not particularly limited. For example, referring to FIG. 12, a continuous dummy pattern 132 is disposed between the respective intervals of the ground line 131. However, referring to FIG. 13, a plurality of dummy patterns 132 are disposed between the respective intervals of the ground line 131.

Similarly, the plurality of dummy patterns 132 may include at least one material selected from silver (Ag), palladium (Pd), aluminum (Al), nickel (Ni), titanium (Ti), gold (Au), copper (Cu), platinum (Pt), and the like having excellent conductivity, or a mixture of at least two materials thereof. The dummy pattern 132 may be formed by a known method, such as electro copper plating, electroless copper plating, or the like. According to an example, the dummy pattern 132 may be formed using a method such as a chemical vapor deposition (CVD) method, a physical vapor deposition (PVD) method, a sputtering method, a subtractive method, an additive method, a semi-additive process (SAP), a modified semi-additive process (MSAP), or the like, but the method of obtaining the dummy pattern 132 is not limited thereto.

Although FIGS. 5 through 13 illustrate various examples of the second conductive layer 120, the above-mentioned illustrations are not applied to only the second conductive layer 120, but may also be applied to the third conductive layer 150. That is, a ground line of the third conductive layer 150 may also be a conductive path in which a plurality of conductive patterns are connected to each other to form a meander shape, and may have an area in which the signal line 121 is provided. In addition, unit patterns having an opened curve shape or opened bracket shape may be disposed on an edge portion of the ground line, and inner unit patterns having an obliquely inclined shape, obliquely inclined shapes arranged in a zigzag shape, or a curved wave shape, may be disposed between the outer unit patterns having the opened curve shape or opened bracket shape disposed along the edge portion. The above-mentioned unit patterns may be connected to each other to form return paths for a variety of signals transferred through the signal line 121. That is, to significantly reduce a difference of values of characteristic impedances for each of positions of the signal line while maintaining high characteristic impedance, the ground line 131 may be patterned, for example, in an oblique meander shape or other repetitive shape. In addition, the third conductive layer 150 may also include dummy patterns of various shapes, and for example, a plurality of dummy patterns which are not connected to the ground line may be disposed between the intervals of the ground line. An additional detailed description refers to the contents described with respect to FIGS. 5 through 13.

Figure 14:
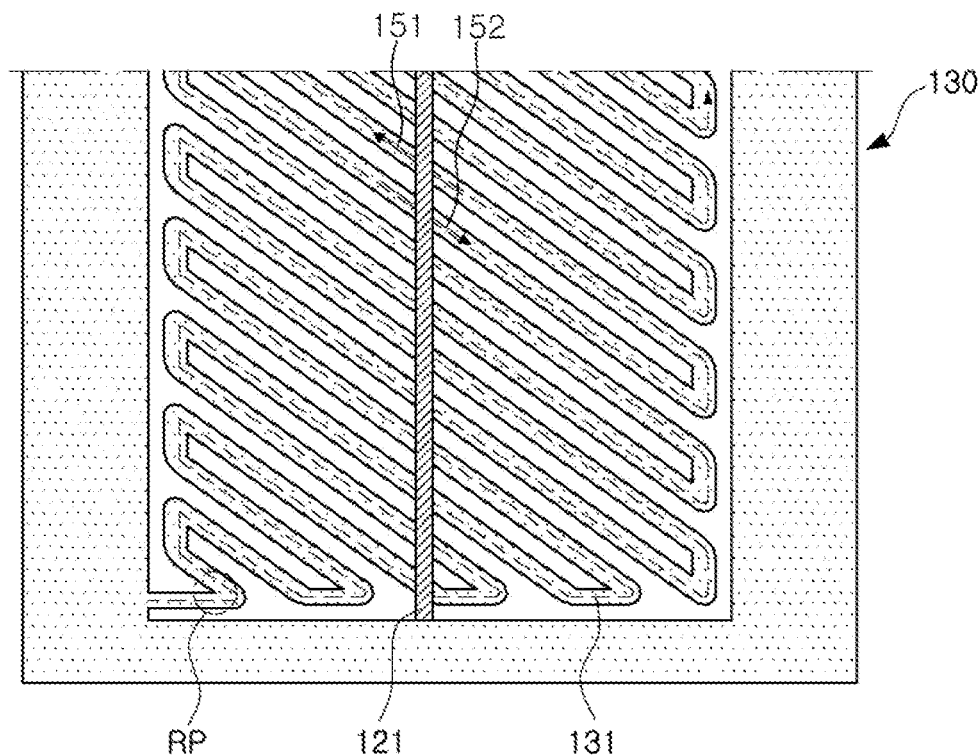
FIG. 14 schematically illustrates a signal return path of an example of a ground line patterned in an oblique meander shape.

FIG. 14 schematically illustrates a signal return path RP of the ground line 131 patterned in an oblique meander shape. Referring to FIG. 14, because the signal return path RP of the ground line 131 patterned in the oblique meander shape is meanderingly moved in a diagonal line direction along one path, the signal return path RP may have a path longer than the signal line 121. Further, the return path RP includes several portions in which the ground line passes across the signal line 121 in a plan view of the circuit board. The current directions 151, 152 of the ground line as the ground line passes across the signal line 121 alternate toward two different sides of the signal line 121. In the example illustrated in FIG. 14, the inner conductive patterns include obliquely inclined stripes that are arranged parallel to each other. The current direction 151 in an obliquely inclined stripe is opposite to the current direction 152 in an adjacent obliquely inclined stripe such that the current directions 151, 152 form a 180 degree angle with respect to each other.

As noted above, in accordance with the trend for producing slender electronic products, the thickness of the insulating layer may be reduced, thereby making it difficult to maintain the characteristic impedance of a circuit board. As such, in a case in which the signal return path RP is implemented to be longer, since a compensation for an impedance decrease caused by the decrease in the thickness of the insulating layer is possible, the characteristic impedance of the circuit board may be more effectively maintained.

Figure 15:
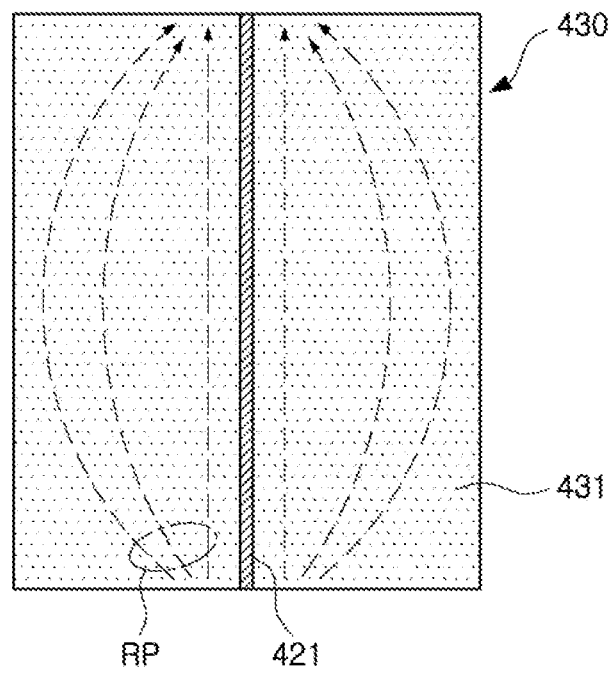
FIG. 15 schematically illustrates a signal return path of an example of a ground surface patterned in a fill shape.

FIG. 15 schematically illustrates a signal return path RP of a ground surface 431 patterned in a fill shape. Referring to FIG. 15, the signal return path RP of the ground surface 431 patterned in the fill shape may be moved along various paths. As a result, it may be difficult to control the signal return path RP. Further, because the ground surface 431 patterned in the fill shape has the signal return path RP shorter than the ground line 131 patterned in the oblique meander shape, a compensation for an impedance decrease caused by the decrease in the thickness of the insulating layer is expected to be insufficient to produce a circuit board having the desired impedance.

Figure 16:
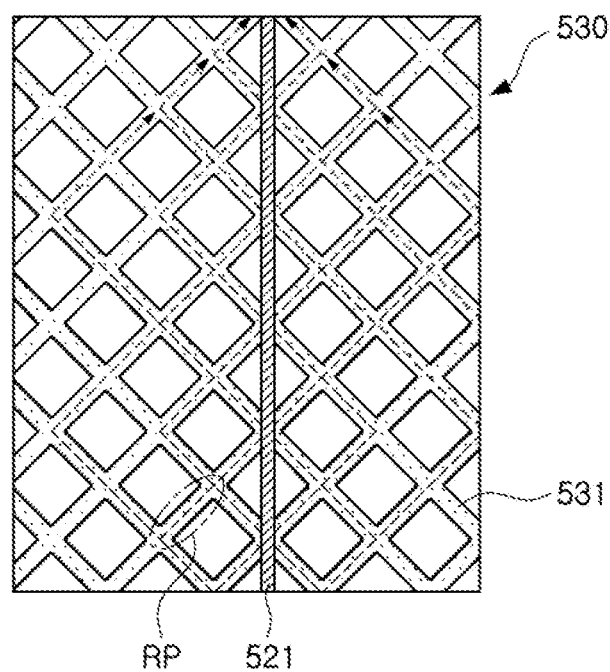
FIG. 16 schematically illustrates a signal return path of an example of a ground line patterned in a hatch shape.

FIG. 16 schematically illustrates a signal return path RP of a ground line 531 patterned in a hatch shape. Referring to FIG. 16, the signal return path RP of the ground line 531 patterned in the hatch shape may also be moved along various paths. As a result, it may be difficult to control the signal return path RP. Further, because the ground line 531 patterned in the hatch shape may have the signal return path RP longer than the ground surface 431 patterned in the fill shape, but may have the signal return path RP shorter than the ground line 131 patterned in the oblique meander shape, a compensation for an impedance decrease caused by the decrease in the thickness of the insulating layer is expected to be insufficient in comparison to the ground line 131 patterned in the oblique meander shape illustrated in FIG. 14.

Figure 17:
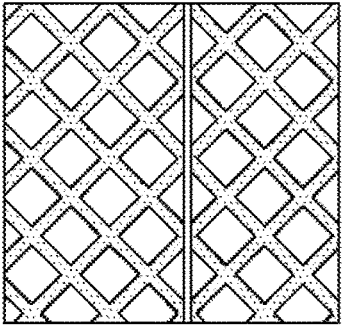
FIG. 17 schematically illustrates a corresponding relationship for each of the positions of the signal lines of examples of ground lines patterned in the oblique meander shape and ground line patterned in the hatch shape.

FIG. 17 schematically illustrates a corresponding relationship for each positions of the signal line of the ground line patterned in an oblique meander shape and the ground line patterned in the hatch shape. In this example, "the corresponding relationship for each of the positions" of the signal line may be determined in relation to "a case in which the signal lines are disposed in parallel with each other". Referring to FIG. 17, it may be seen that the ground line patterned in the oblique meander shape has corresponding pattern shapes which are constantly maintained in any case of a position 1 and a position 2 of the signal line. In addition, referring to FIGS. 14 and 17, it may be seen that the corresponding return path is constantly maintained in any case of the position 1 and the position 2 of the signal line. On the other hand, it may be seen that the ground line patterned in the hatch shape has the corresponding pattern shapes which are different depending on the position 1 and the position 2 of the signal line. In addition, referring to FIGS. 16 and 17, it may be seen that the corresponding return paths varies depending on the position 1 and the position 2 of the signal line. That is, it may be seen that, because a ground line patterned in an oblique meander shape may implement the signal return path to be longer, a circuit board with high impedance may be obtained. Further, with the oblique meander shape, because the pattern shape and the signal return path may be constantly maintained with respect to the signal line, a change in impedance resulting from different positions of the signal line may be significantly reduced. Therefore, it may be seen that the impedance may be effectively matched by varying a design of the ground, and not in the signal line.

Figure 18:
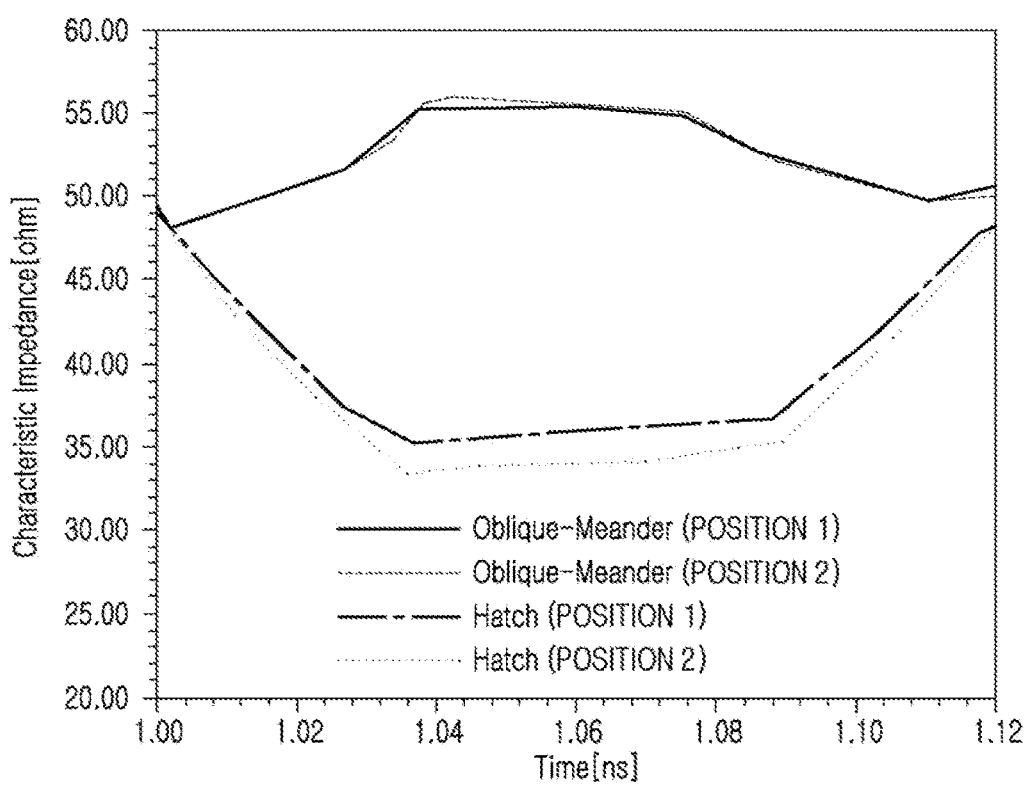
FIG. 18 schematically illustrates a simulation result of characteristic impedance for each of the positions of the signal line of the examples of ground lines patterned in the oblique meander shape and the examples of ground lines patterned in the hatch shape.

FIG. 18 schematically illustrates a simulation result of characteristic impedance for each of the positions of the signal line of a ground line patterned in an oblique meander shape and a ground line patterned in a hatch shape. In the graph, a position 1 and a position 2 refer to the position 1 and the position 2 of the signal line illustrated in FIG. 17. Referring to FIG. 18, it may be seen that the ground line patterned in the oblique meander shape has characteristic impedance over time basically maintained to be higher than the ground line patterned in the hatch shape. In addition, it may be seen that the ground line patterned in the oblique meander shape has a difference of the characteristic impedances over time of about 1Ω or less at both the position 1 and the position 2. For example, it may be seen that the difference of the characteristic impedances of the position 1 and the position 2 is merely about 0.01Ω at 1.06 ns. On the other hand, a case in which the difference of the characteristic impedances over time of the position 1 and the position 2 is large to an extent as to exceed 1Ω exists in the ground line patterned in the hatch shape. For example, it may be seen that the difference of the characteristic impedances of the position 1 and the position 2 is significantly large to the extent of about 2Ω at 1.06 ns. That is, it may be supported by a simulation result that, because the ground line patterned in the oblique meander shape may implement the signal return path to be longer, high impedance may be implemented, and since it may constantly maintain the pattern shape and the signal return path corresponding to a signal line, an impedance difference according to the positions of the signal line may be significantly reduced.

As set forth above, according to the embodiments in the present disclosure, the new ground pattern structure capable of significantly reducing the difference of the values of characteristic impedances for each of the positions of the signal line while maintaining high characteristic impedance, and the circuit board using the same, may be provided.

The expression that "components are constant" as used in the present disclosure refers to a case in which there are many components and the components are formed substantially the same as each other or to a case in which the components are exactly the same as each other. The expression that the "components are constant" takes into account an error range that may inevitably occur during a process of forming the components. Further, the expression that the "components are constant" takes into account of a case in which the components are generally the same as each other but only a specific portion is slightly different by intentionally varying only the specific portion in order to avoid the scope of the present disclosure.

In the present disclosure, terms "first", "second", and the like, are used to distinguish one component from another component, and do not limit a sequence and/or importance, and the like, of the corresponding components. In some cases, a first component may be named a second component, and a second component may also be similarly named a first component, without departing from the scope of the present disclosure.

The term "example" as used in the present disclosure does not refer to a single same example, but is provided in order to emphasize and describe different unique features. However, the above suggested examples may be implemented to be combined with a feature of another example. For example, even though particulars described in a specific example are not described in another example, it may be understood as a description related to another example unless described otherwise.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A circuit board comprising:
   a first conductive layer;
   a second conductive layer; and
   an insulating layer disposed between the first conductive layer and the second conductive layer,
   wherein the first conductive layer comprises a signal line, the second conductive layer comprises a ground line electrically separated from the signal line, in a corresponding area provided with the signal line and the ground line, the ground line is patterned, and
   wherein an outer unit pattern of the ground line is substantially parallel to the signal line and an inner unit pattern of the ground line is oblique to the signal line.

2. The circuit board of claim 1, wherein the ground line comprises a pattern area patterned in a meander shape such that changing a position of the signal line within the corresponding area results in an impedance change of 1Ω or less.

3. The circuit board of claim 2, wherein changing a position of the signal line within the corresponding area comprises a lateral displacement across the ground line.

4. The circuit board of claim 1, wherein a shape of a unit pattern of the ground line under the signal line is substantially the same regardless of a position of the signal line within the corresponding area.

5. The circuit board of claim 1, wherein, in the corresponding area provided with the signal line and the ground line, a return path of the ground line corresponding to the signal line remains substantially the same regardless of a position of the signal line.

6. The circuit board of claim 1, wherein the ground line comprises a pattern area patterned in an oblique meander shape.

7. The circuit board of claim 1, wherein the second conductive layer further comprises dummy patterns, and the dummy patterns are not connected to the ground line.

8. A circuit board comprising:
   a first conductive layer;
   a second conductive layer; and
   an insulating layer disposed between the first conductive layer and the second conductive layer,
   wherein the first and second conductive layers comprise a signal line and a ground line, respectively, outer unit patterns are disposed along edge portions of the ground line, inner unit patterns are disposed between the outer unit patterns, and each of the outer unit patterns connect the inner unit patterns to one another,
   wherein the ground line and the signal line are electrically separate from each other, and
   wherein an outer unit pattern of the ground line is substantially perpendicular to the signal line.

9. The circuit board of claim 8, wherein the outer unit patterns have an opened curve shape, and the inner unit patterns have an obliquely inclined shape, the outer unit patterns and the inner unit patterns being connected to each other to form a return path of the ground line.

10. The circuit board of claim 8, wherein the inner unit patterns have an obliquely inclined shape with a constant width.

11. The circuit board of claim 8, wherein the inner unit patterns are disposed with a constant interval therebetween.

12. The circuit board of claim 8, wherein the inner unit patterns comprise obliquely inclined stripes aligned along substantially the same direction.

13. The circuit board of claim 8, wherein the second conductive layer further comprises dummy patterns, and the dummy patterns are disposed between the outer unit patterns and the inner unit patterns.

14. A circuit board comprising:
    a first conductive layer comprising a signal line;
    a second conductive layer comprising a ground line; and
    an insulating layer disposed between the first conductive layer and the second conductive layer,
    wherein the ground line comprises a pattern area in which the ground line intersects the signal line in a plan view in a plurality of passes across the signal line, a current direction in the ground line alternates in the plurality of passes across the signal line, the ground line and the signal line are electrically separate from each other, and
    wherein an outer unit pattern of the ground line is substantially parallel to the signal line and an inner unit pattern of the ground line is oblique to the signal line.

15. The circuit board of claim 14, wherein the plurality of passes across the signal line comprise a first pass and a second pass across the signal line, and
    the current direction across the first pass is configured to be substantially opposite to the current direction across the second pass.

16. The circuit board of claim 14, wherein the ground line is patterned in an oblique meander shape in the pattern area.

17. The circuit board of claim 14, wherein the current direction in the ground line does not change when a position of the signal line changes within a corresponding area of the ground line.

18. A conductive pattern structure for a circuit board, the conductive pattern structure comprising:

outer conductive patterns disposed along edge portions of a pattern area; and inner conductive patterns disposed in the pattern area and connected to one another via the outer conductive patterns to form a conductive path having a meander shape, wherein the inner conductive patterns comprise a first inner conductive pattern separated from a second inner conductive pattern, and wherein the outer conductive patterns are parallel to the edge portions and the inner conductive patterns are oblique to the edge portions.

19. The conductive pattern structure of claim 18, wherein the inner conductive patterns comprise obliquely inclined conductive stripes that are connected via the outer conductive patterns to form an oblique meander shape.

20. The conductive pattern structure of claim 18, wherein the first inner conductive pattern and the second inner conductive pattern are disposed parallel to each another such that a current direction through the first inner conductive pattern and a current direction through the second inner conductive pattern are opposite to each other.

* * * * *